US011100990B2

(12) United States Patent
Lim et al.

(10) Patent No.: US 11,100,990 B2
(45) Date of Patent: Aug. 24, 2021

(54) MEMORY DEVICE FOR AVOIDING MULTI-TURN ON OF MEMORY CELL DURING READING, AND OPERATING METHOD THEREOF

(71) Applicant: SAMSUNG ELECTRONICS CO., LTD., Suwon-si (KR)

(72) Inventors: Ji-Hoon Lim, Hwaseong-si (KR); Jongryul Kim, Dangjin-si (KR); Taehui Na, Seoul (KR); Venkataramana Gangasani, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/813,826

(22) Filed: Mar. 10, 2020

(65) Prior Publication Data
US 2021/0020226 A1    Jan. 21, 2021

(30) Foreign Application Priority Data
Jul. 19, 2019    (KR) .................. 10-2019-0087415

(51) Int. Cl.
*G11C 11/408* (2006.01)
*G11C 13/00* (2006.01)
*G11C 11/22* (2006.01)
*G11C 11/16* (2006.01)

(52) U.S. Cl.
CPC ........ *G11C 13/004* (2013.01); *G11C 11/1673* (2013.01); *G11C 11/2273* (2013.01); *G11C 13/0004* (2013.01)

(58) Field of Classification Search
CPC ........... G11C 13/0026; G11C 13/0028; G11C 13/003; G11C 13/0069; G11C 13/004
See application file for complete search history.

(56) References Cited

U.S. PATENT DOCUMENTS

| 6,982,913 | B2 | 1/2006 | Oh et al. |
| 7,239,562 | B2 | 7/2007 | Takemura |
| 7,570,530 | B2 | 8/2009 | Choi et al. |
| 7,760,549 | B2 | 7/2010 | Isobe et al. |
| 7,885,098 | B2 | 2/2011 | Ro et al. |
| 8,848,426 | B2 | 9/2014 | Azuma et al. |
| 9,142,271 | B1 | 9/2015 | Srinivasan et al. |
| 9,165,647 | B1 | 10/2015 | Guliani et al. |
| 9,543,005 | B2 | 1/2017 | Guliani et al. |
| 2007/0058425 | A1* | 3/2007 | Cho .................. G11C 13/0069 365/163 |

(Continued)

FOREIGN PATENT DOCUMENTS

KR    10-1204923    11/2012

*Primary Examiner* — Mushfique Siddique
(74) *Attorney, Agent, or Firm* — F. Chau & Associates, LLC

(57) ABSTRACT

A memory device includes a memory cell connected to a word line and a bit line, a row driver that drives the word line to a precharge level, a column driver that drives the bit line to a first target level, a sense amplifier that senses a first sensing level of the word line after the first target level is applied to the memory cell, and a read control circuit that controls the column driver so that a second target level different from the first target level is selectively applied to the memory cell depending on the first sensing level sensed by the sense amplifier.

19 Claims, 21 Drawing Sheets

(56) References Cited

U.S. PATENT DOCUMENTS

| | | | | |
|---|---|---|---|---|
| 2010/0118595 A1* | 5/2010 | Bae | ............... | G11C 13/0038 |
| | | | | 365/148 |
| 2014/0347912 A1* | 11/2014 | Siau | ............... | G11C 13/004 |
| | | | | 365/148 |
| 2019/0378567 A1* | 12/2019 | Gangasani | ......... | G11C 13/0033 |
| 2019/0385678 A1* | 12/2019 | Gangasani | ............. | G11C 8/12 |
| 2020/0005864 A1* | 1/2020 | Gangasani | ......... | G11C 13/0033 |
| 2020/0168273 A1* | 5/2020 | Kim | ............... | G11C 13/0004 |
| 2020/0350009 A1* | 11/2020 | Lee | ............... | G11C 13/004 |

\* cited by examiner

FIG. 15

MEMORY DEVICE FOR AVOIDING MULTI-TURN ON OF MEMORY CELL DURING READING, AND OPERATING METHOD THEREOF

CROSS-REFERENCE TO RELATED APPLICATIONS

This U.S. non-provisional patent application claims priority under 35 U.S.C. § 119 to Korean Patent Application No. 10-2019-0087415 filed on Jul. 19, 2019, in the Korean Intellectual Property Office, the disclosure of which is incorporated by reference in its entirety herein.

BACKGROUND

1. Technical Field

Embodiments of the inventive concept disclosed herein relate to a memory device and an operating method thereof, and more particularly, relate to a memory device for avoiding a multi-turn on of a memory cell and an operating method thereof.

2. Discussion of Related Art

Memory in next-generation memory devices may include phase-change memory cells. A phase-change memory cell changes between one of two physics states when a current is applied, where each state has a different resistance that can be used to represent one of two different logic levels. An electrical signal may be applied to phase-change memory cells when writing data to a phase-change memory cell and when reading data from the phase-change memory cell. The physical state of the phase-change memory cell may be changed by the electrical signal when writing data, and this is intended. However, sometimes the physical state of the phase-change memory cell is unintentionally changed by the electrical signal when reading data. Accordingly, the reliability or write endurance of phase-change memory may be reduced.

SUMMARY

At least one embodiment of the inventive concept provides a memory device for avoiding a multi-turn on of a memory cell and an operating method thereof.

According to an exemplary embodiment of the inventive concept, a memory device includes a memory cell connected to a word line and a bit line, a row driver that drives the word line to a precharge level, a column driver that drives the bit line to a first target level, a sense amplifier that senses a first sensing level of the word line after the first target level is applied to the memory cell, and a read control circuit that controls the column driver so that a second target level different from the first target level is selectively applied to the memory cell depending on the first sensing level sensed by the sense amplifier.

According to an exemplary embodiment of the inventive concept, a memory device includes a plurality of bays and a plurality of bay control circuits. Each bay includes a memory cell connected to a word line and a bit line. Each bay control circuit is configured to access the memory cell through the word line and the bit line. Each bay control circuit is configured to perform a first sensing operation on the memory cell by driving the word line to a precharge level and driving the bit line to a first target level, based on a first read command; and perform a second sensing operation on the memory cell by driving the word line to the precharge level and selectively driving the bit line to a second target level, based on a first sensing result of the first sensing operation.

According to an exemplary embodiment of the inventive concept, an operating method of a memory device includes: driving a word line connected to a memory cell to a precharge level; driving a bit line connected to the memory cell to a first target level; performing a first sensing operation for sensing a first sensing level of the word line after the bit line is driven to the first target level; and determining whether to perform a second sensing operation by using a second target level different from the first target level, depending on a first sensing result of the first sensing operation.

BRIEF DESCRIPTION OF THE FIGURES

The inventive concept will become apparent by describing in detail exemplary embodiments thereof with reference to the accompanying drawings.

Figure 15:
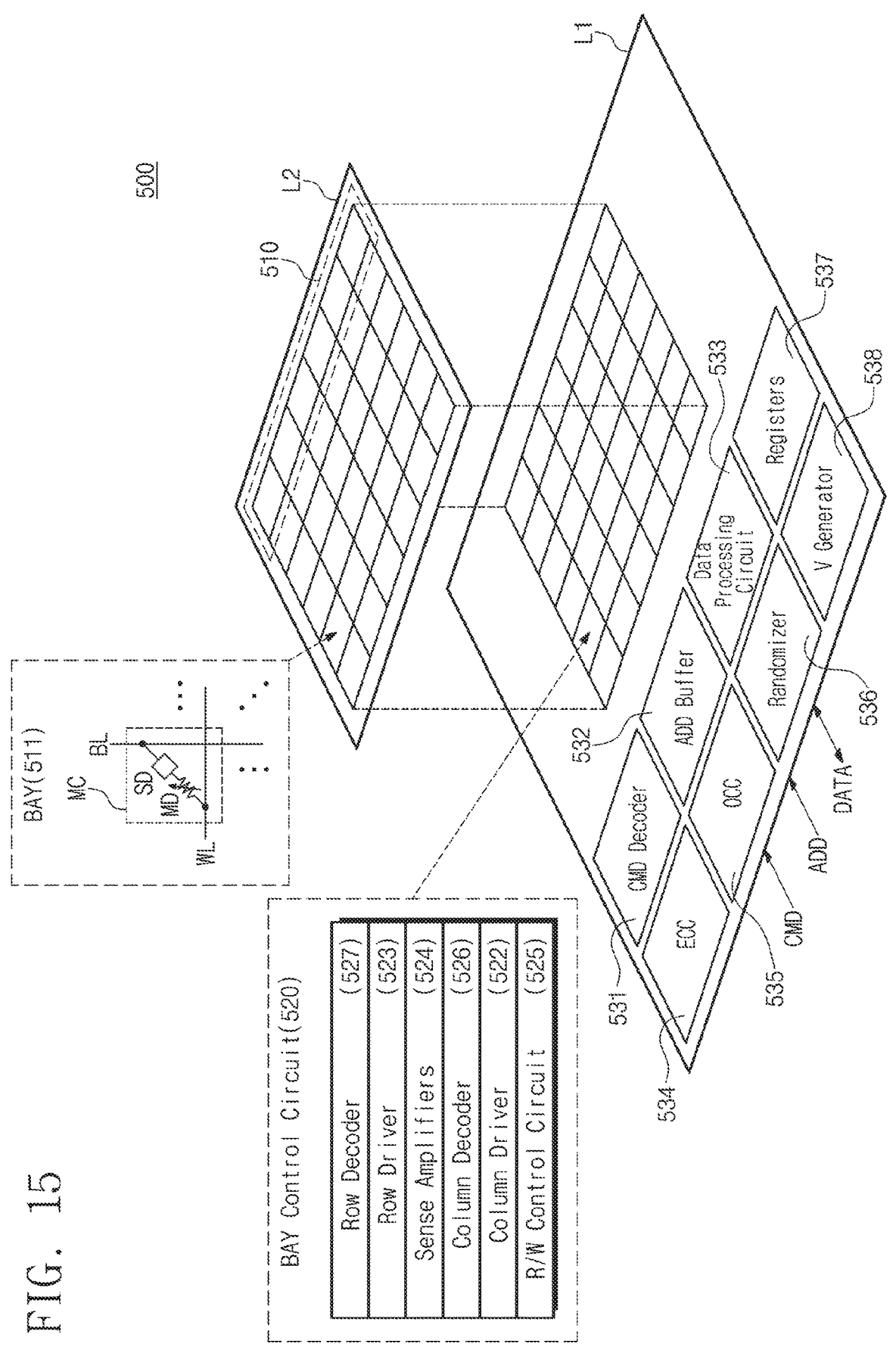

FIGS. 12 to 15 are block diagrams illustrating a memory device according to an exemplary embodiment of the inventive concept.

DETAILED DESCRIPTION OF THE EXEMPLARY EMBODIMENTS

Figure 1:
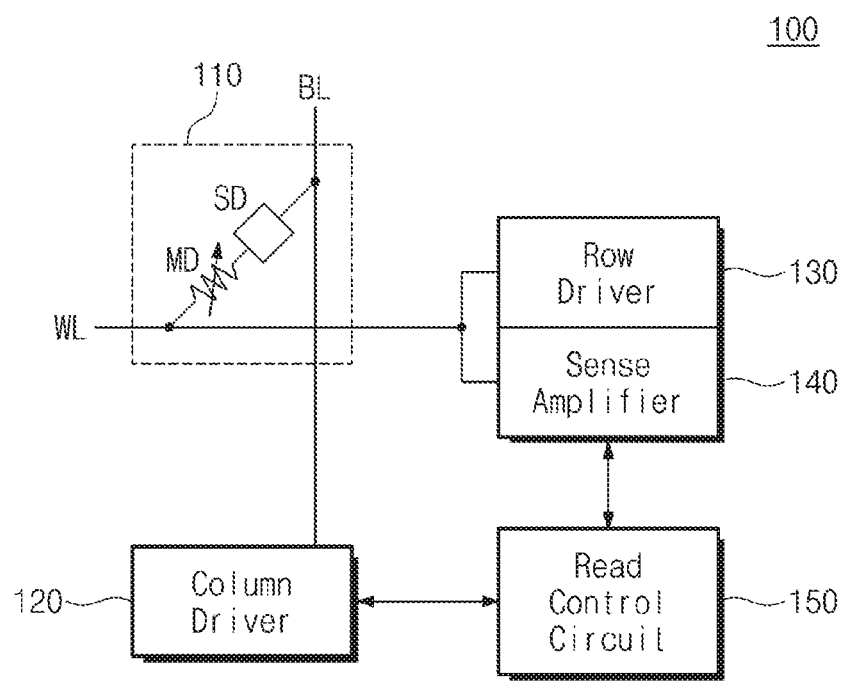
FIG. 1 illustrates a block diagram of a memory device according to an exemplary embodiment of the inventive concept.

FIG. 1 illustrates a block diagram of a memory device according to an exemplary embodiment of the inventive concept. A memory device 100 includes a memory cell 110, a column driver 120 (e.g., a driving circuit), a row driver 130 (e.g., driving circuit), a sense amplifier 140, and a read control circuit 150.

A first end of the memory cell 110 may be connected to a word line WL, and a second end of the memory cell 110 may be connected to a bit line BL. In an exemplary embodiment of the inventive concept, the memory cell 110 is a resistive memory cell. For example, the memory cell 110 may be a nonvolatile memory cell such as a phase-change random access memory (PRAM) cell, a magnetoresistive RAM (MRAM) cell, a resistive RAM (RRAM) cell, or a ferroelectric RAM (FRAM) cell. Below, it is assumed that the memory cell 110 is the PRAM cell, but the inventive concept is not limited thereto. The memory cell 110 may include a resistive memory (storage) element MD and a selection element SD. The memory element MD may include a phase change material. In an exemplary embodiment, the phase change material has a high resistance state (e.g., a high resistance) when the material has an amorphous state and has a low resistance state (e.g., a low resistance) when the material has a crystalline state, depending on an electrical signal applied to the memory cell 110, Joule's heat, or a temperature. In an exemplary embodiment of the inventive concept, the memory element MD includes chalcogenide materials. The selection element SD may be connected in series to the memory element MD. For example, the selection element SD may be a diode element or an ovonic threshold switch (OTS) element having a bidirectional characteristic. The selection element SD may have a threshold switching characteristic that is nonlinear and an S-shaped I-V curve (refer to FIG. 4). In an exemplary embodiment of the inventive concept, the selection element SD includes chalcogenide materials.

The column driver 120 may drive the bit line BL. The row driver 130 may drive the word line WL. The sense amplifier 140 may sense a voltage level (or a current level) of the word line WL to determine a sensing result. The sensing result of the sense amplifier 140 may indicate data stored in the memory cell 110. The read control circuit 150 may control the column driver 120, the read control circuit 150, and the sense amplifier 140 to read data stored in the memory cell 110. For example, under control of the read control circuit 150, a read voltage (refer to FIG. 2, VREAD) may be applied across the memory cell 110 by the column driver 120 and the row driver 130. After the read voltage is applied, the sense amplifier 140 may sense data of the memory cell 110 under control of the read control circuit 150.

An example is illustrated in FIG. 1 where the memory element MD is connected to the word line WL and the selection element SD is connected to the bit line BL. For example, because the memory cell 110 has a bidirectional characteristic, the memory element MD may be connected to the bit line BL, and the selection element SD may be connected to the word line WL. The word line WL may be referred to as a "bit line", and the bit line BL may be referred to as a "word line".

Figure 2:
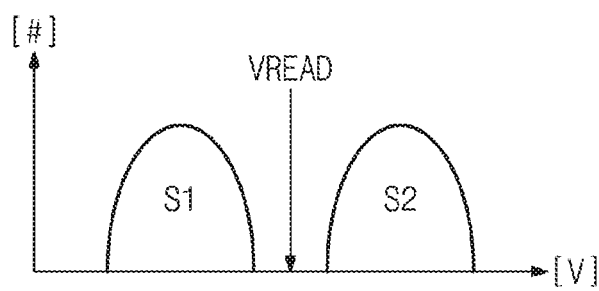
FIGS. 2 and 3 illustrate exemplary threshold voltage distributions of memory cells of FIG. 1.
Figure 3:
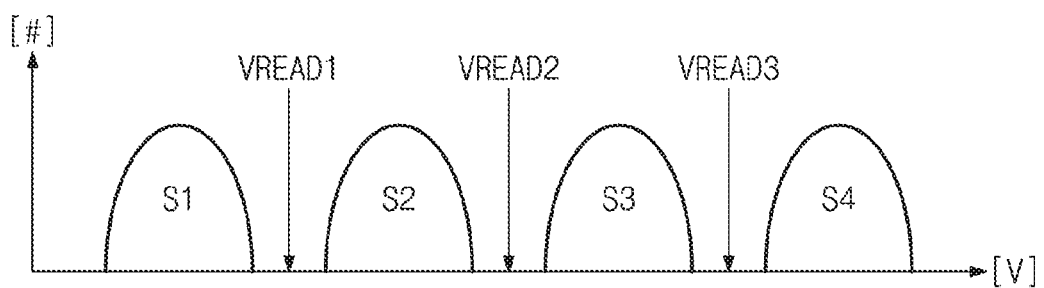

FIGS. 2 and 3 illustrate exemplary threshold voltage distributions of memory cells of FIG. 1. In FIGS. 2 and 3, a horizontal axis represents a threshold voltage, and a vertical axis represents the number of memory cells 110. Due to various factors such as process, voltage, and temperature (PVT) variations, a write (or program) condition, a read condition, a write count, a read count, and an elapsed time, threshold voltages of the memory cells 110 having the same state may be different and may form a distribution. FIG. 2 relates to the case where the memory cell 110 stores one bit data. The memory cell 110 may have a threshold voltage corresponding to one of states S1 and S2 indicating digital logical values of "0" and "1". The read voltage VREAD may be applied to the memory cell 110 to identify (read) a state (e.g., S1 or S2) of the memory cell 110. FIG. 3 refers to the case where the memory cell 110 stores data having one or more bits (e.g., two bits). The memory cell 110 may have a threshold voltage corresponding to one of states S1 to S4 indicating digital logical values of 00, 01, 10, and 11. Read voltages VREAD1 to VREAD3 may be applied to the memory cell 110 to identify (read) a state (e.g., one of S1 to S4) of the memory cell 110. The inventive concept is not limited to the above examples of the memory cell 110 storing the specific number of bits.

Figure 4:
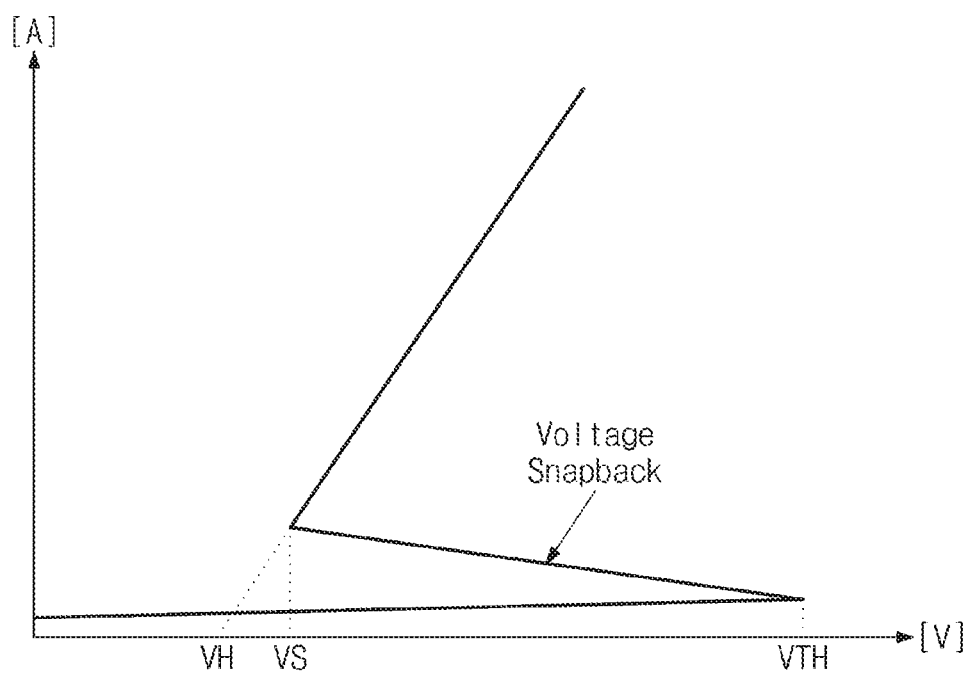
FIG. 4 is a graph illustrating an exemplary I-V characteristic of a memory cell of FIG. 1.

FIG. 4 is a graph illustrating an I-V characteristic of a memory cell of FIG. 1. In FIG. 4, a horizontal axis represents a voltage across the memory cell 110 (i.e., a difference between voltages applied to opposite ends of the memory cell 110), and a vertical axis represents a current flowing through the memory cell 110. A current flowing through the memory cell 110 may be very small until the voltage across the memory cell 110 reaches a threshold voltage VTH. When the voltage across the memory cell 110 reaches the threshold voltage VTH of the memory cell 110, the memory cell 110 may be turned on, and a voltage snapback may occur. The threshold voltage VTH may refer to a voltage at which the memory cell 110 switches from a RESET state to a SET state. The memory cell 110 is turned off in the RESET state and is turned on in the SET state. When the voltage snapback occurs, a current flowing through the memory cell 110 may increase. A voltage across the memory cell 110 may change (or decrease) from the threshold voltage VTH to a switching voltage VS. A voltage of a point at which a line extending from the I-V graph after the voltage snapback occurs and the horizontal axis cross each other may be a hold voltage VH. One of the read voltages VREAD, VREAD1, VREAD2, or VREAD3 may be applied to the memory cell 110 having the threshold voltage VTH corresponding to any state, and data stored in the memory cell 110 may be read depending on a turn-on state or turn-off state of the memory cell 110.

Figure 5:
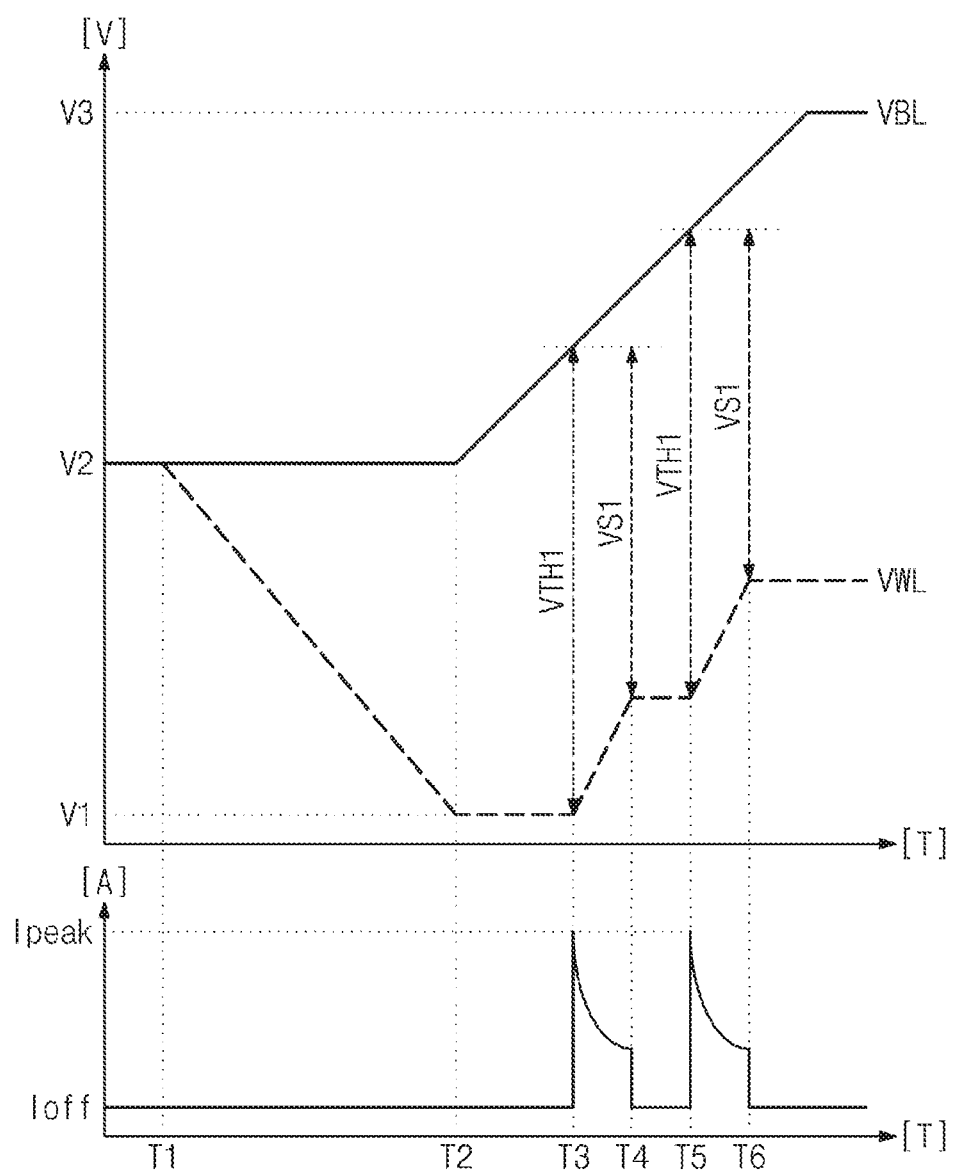
FIGS. 5 and 6 illustrate an exemplary word line voltage, an exemplary bit line voltage, and an exemplary current flowing through a memory cell when a read voltage of FIG. 2 is applied to a memory cell of FIG. 1.
Figure 6:
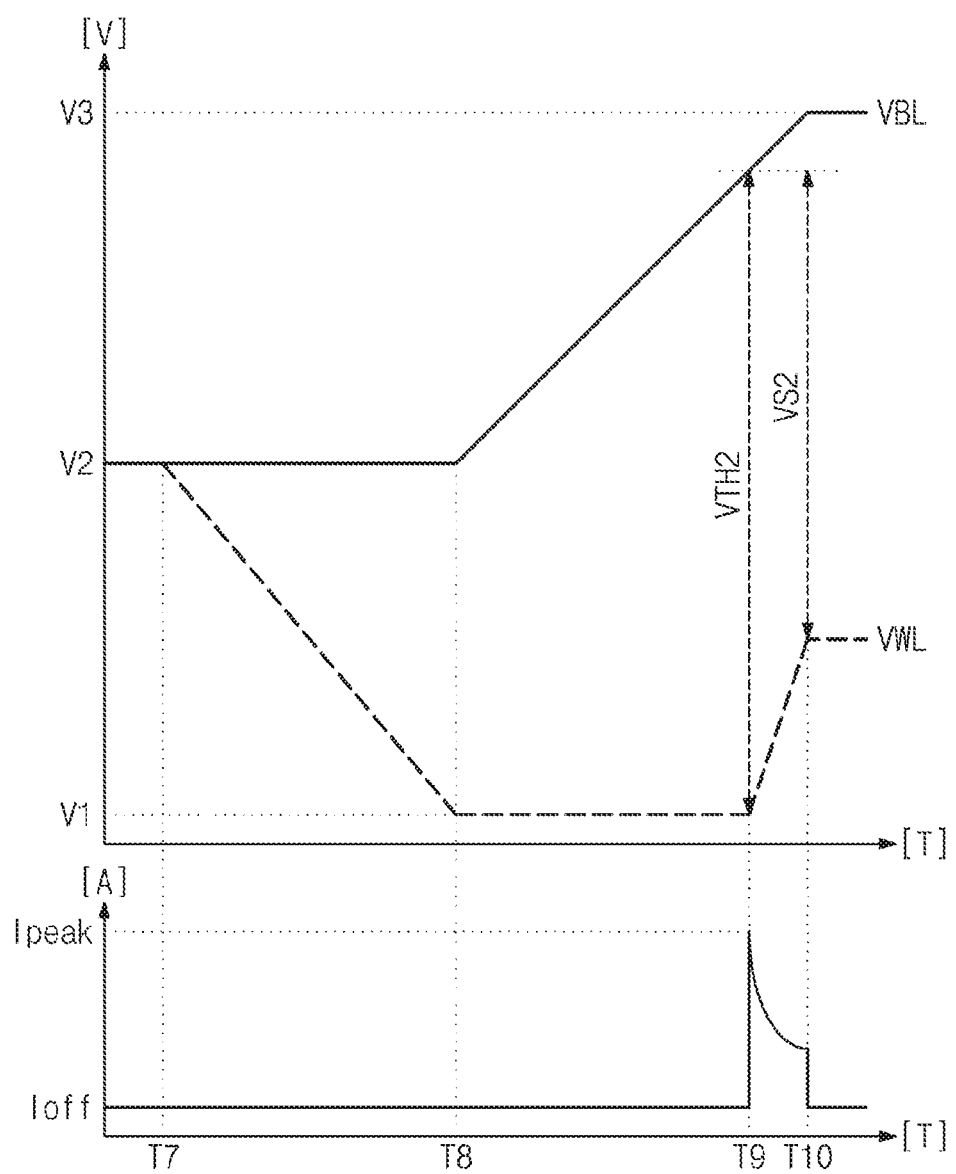

FIGS. 5 and 6 illustrate an exemplary word line voltage, an exemplary bit line voltage, and an exemplary current flowing through a memory cell when a read voltage of FIG. 2 is applied to a memory cell of FIG. 1. The row driver 130 drives (or precharges) the word line WL to a level V1 (referred to as a "precharge level") lower than an initial level V2 (or an equalization level) from the initial level V2, from a time T1 to a time T2. When a word line voltage VWL is driven to the level V2 (or the word line voltage VWL reaches the level V2), the row driver 130 floats (or does not drive) the word line WL, and the word line WL is floated from the time T2. For example, the word line WL may be floated from time T2 to time T3.

The column driver 120 drives the bit line BL to a level V3 higher than an initial level V2 from the initial level V2, after time T2. For example, the level V2 may be an intermediate level of the levels V1 and V3 or may correspond to a ground voltage GND. A voltage difference (or a potential difference) between the levels V1 and V3 may correspond to the read voltage VREAD of FIG. 2 and one of the read voltages VREAD1, VREAD2, and VREAD3 of FIG. 3. Below, the read voltage VREAD of FIG. 2 and one of the read voltages VREAD1, VREAD2, and VREAD3 of FIG. 3 are referred to as the "read voltage VREAD".

A bit line voltage VBL increases (rises) after time T2, a voltage difference between the bit line voltage VBL and the word line voltage VWL reaches a threshold voltage VTH1 of the memory cell 110 at time T3, a voltage across the memory cell 110 may be the threshold voltage VTH1 or greater (or exceed the threshold voltage VTH1), and the memory cell 110 is turned on. At time T3, a peak current Ipeak flows through the memory cell 110. From the time T1 to the time T3, the memory cell 110 is turned off, and a current flowing through the memory cell 110 is an off current Ioff that is very small. Because the word line WL is floated from the time T2 to the time T3, the word line voltage VWL may gradually increase due to the off current Ioff. However, for convenience of illustration, the word line voltage VWL is illustrated as being uniform. As the word line voltage VWL increases due to the peak current Ipeak from the time T3, a magnitude of the voltage across the memory cell 110 decreases, and a current flowing through the memory cell 110 decreases from the peak current Ipeak. At a time T4, the voltage across the memory cell 110 reaches a switching voltage VS1, the off current Ioff flows through the memory cell 110, and the memory cell 110 is turned off. In FIG. 5, a time period from the time T3 to the time T4 is exaggeratedly illustrated to show a decrease of the peak current Ipeak. The time interval from the time T3 to the time T4 may be very short. An example is illustrated where the voltage across the memory cell 110 is greater in magnitude than the switching voltage VS1 at the time T4, and the voltage across the memory cell 110 may be referred to as the switching voltage VS1.

The column driver 120 increases the bit line voltage VBL after the time T2. For example, a voltage difference between the bit line voltage VBL and the word line voltage VWL again reaches the threshold voltage VTH1 of the memory cell 110 at a time T5, a voltage across the memory cell 110 may be the threshold voltage VTH1 or greater (or exceed the threshold voltage VTH1), and the memory cell 110 is turned on. At the time T5, the peak current Ipeak again flows through the memory cell 110. As the word line voltage VWL increases after the time T5, a magnitude of the voltage across the memory cell 110 decreases, and a current flowing through the memory cell 110 decreases from the peak current Ipeak. At a time T6, the voltage across the memory cell 110 again reaches the switching voltage VS1, the off current Ioff flows through the memory cell 110, and the memory cell 110 is again turned off. Similar to the time interval from the time point T3 to the time point T4, a time interval from the time T5 to the time T6 may be very short. The voltage across the memory cell 110 at the time T6 may be referred to as the switching voltage VS1.

FIG. 6 relates to the case where the memory cell 110 has a threshold voltage VTH2 greater than the threshold voltage VTH1. In an exemplary embodiment, the threshold voltages VTH1 and VTH2 belong to the same physical state indicating the same digital logical value. The word line voltage VWL and the bit line voltage VBL applied to the memory cell 110 until a time T8 of FIG. 6 are substantially equal to the word line voltage VWL and the bit line voltage VBL applied to the memory cell 110 until the time T2 of FIG. 5. A bit line voltage VBL increases (rises) after the time T8, a voltage difference between the bit line voltage VBL and the word line voltage VWL reaches a threshold voltage VTH2 of the memory cell 110 at a time T9, a voltage across the memory cell 110 may be the threshold voltage VTH2 or greater (or exceed the threshold voltage VTH2), and the memory cell 110 is turned on. At the time T9, a peak current Ipeak flows through the memory cell 110. As the word line voltage VWL increases after the time T9, a magnitude of the voltage across the memory cell 110 decreases, and a current flowing through the memory cell 110 decreases from the peak current Ipeak. At a time T10, the voltage across the memory cell 110 reaches a switching voltage VS2, the off current Ioff flows through the memory cell 110, and the memory cell 110 is turned off. Similar to the time interval from the time point T3 to the time point T4, a time interval from the time T9 to the time T10 may be very short. The voltage across the memory cell 110 at the time T10 may be referred to as the switching voltage VS2.

When the read voltage VREAD is applied to the memory cell 110 having the threshold voltage VTH2 greater than the threshold voltage VTH1, the memory cell 110 is turned on only at the time T9. In contrast, returning to FIG. 5, when the read voltage VREAD is applied to the memory cell 110 having the threshold voltage VTH1, the memory cell 110 is turned on at the time T3 and the time T5, respectively (i.e., a multi-turn on). While the read voltage VREAD is once applied to the memory cell 110 in one read operation, the memory cell 110 may be turned on several times, and the peak current Ipeak may flow through the memory cell 110 several times. The peak current Ipeak may locally heat the memory cell 110 to cause a phase change of the memory cell 110. The accumulation of the peak current Ipeak flowing through the memory cell 110 may damage data stored in the memory cell 110, and the reliability or endurance of the memory cell 110 may degrade. For example, if the physical state of the memory cell 110 is supposed to represent data having logic 0 and then the excess heat causes its physical state to change so that the memory cell 110 now represents data having a logic 1, the data may be considered damaged and the reliability of the memory has degraded. Further, since this unintentional state change is essentially an extra write, and memory can only be written so many times before a failure occurs, the write endurance of the memory has degraded. The peak current Ipeak may correspond to a current spike, and a spike induced read disturb SIRD may occur in the memory cell 110.

According to an exemplary embodiment of the inventive concept, the memory cell 110 is turned on only once during one read operation of the memory cell 110 (or while a read voltage is once applied to the memory cell 110) regardless of the threshold voltage VTH1 or VTH2 of the memory cell 110, and thus, a multi-turn on of the memory cell 110 may be avoided. Since the multi-turn on of the memory cell 110 is avoided, the reliability or endurance (e.g., write endurance) of the memory cell 110 may be improved.

Figure 7:
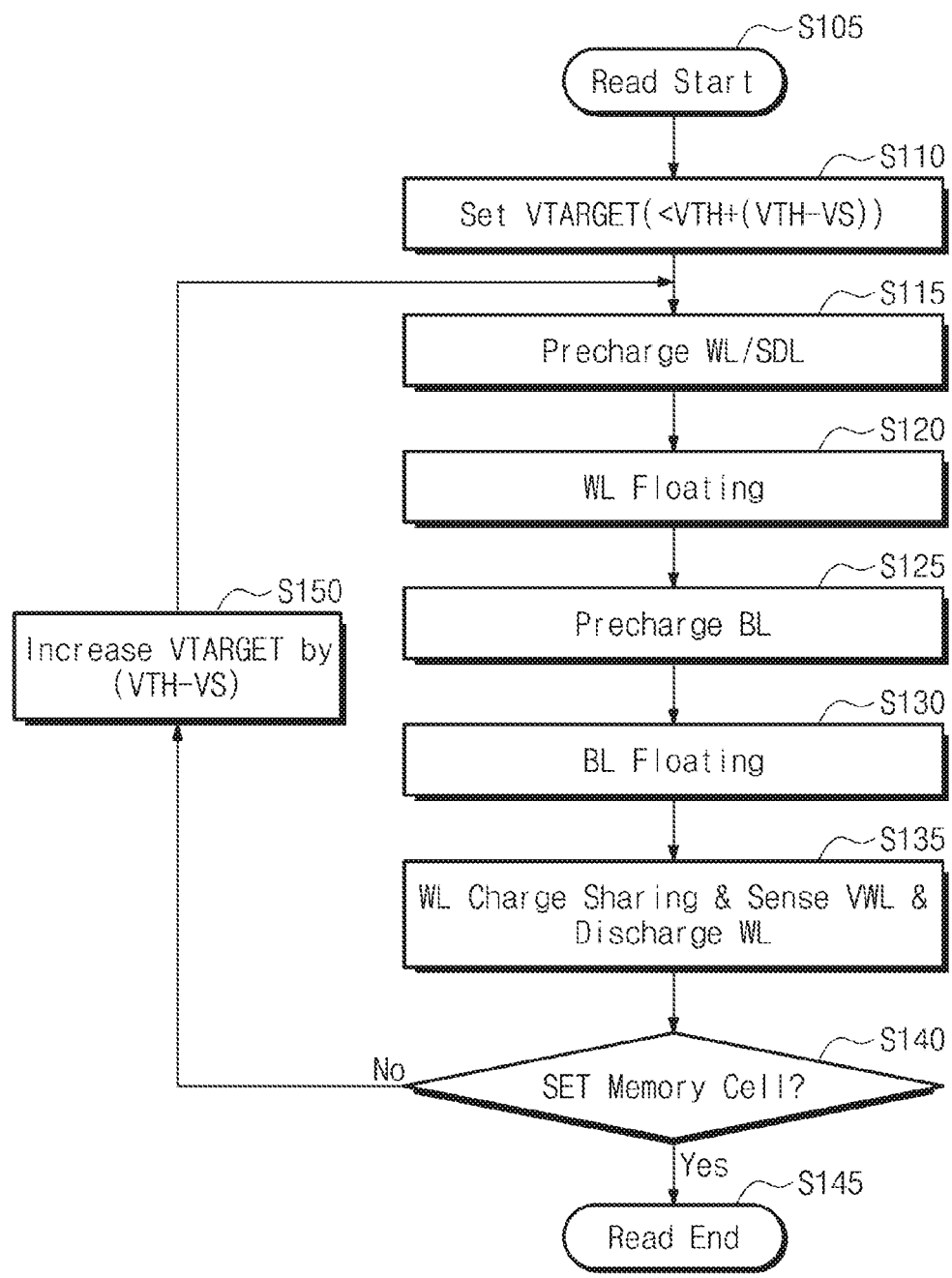
FIG. 7 illustrates a flowchart of an operating method of a memory device of FIG. 1 for preventing multi-turn on of a memory cell according to an exemplary embodiment of the inventive concept.
Figure 8:
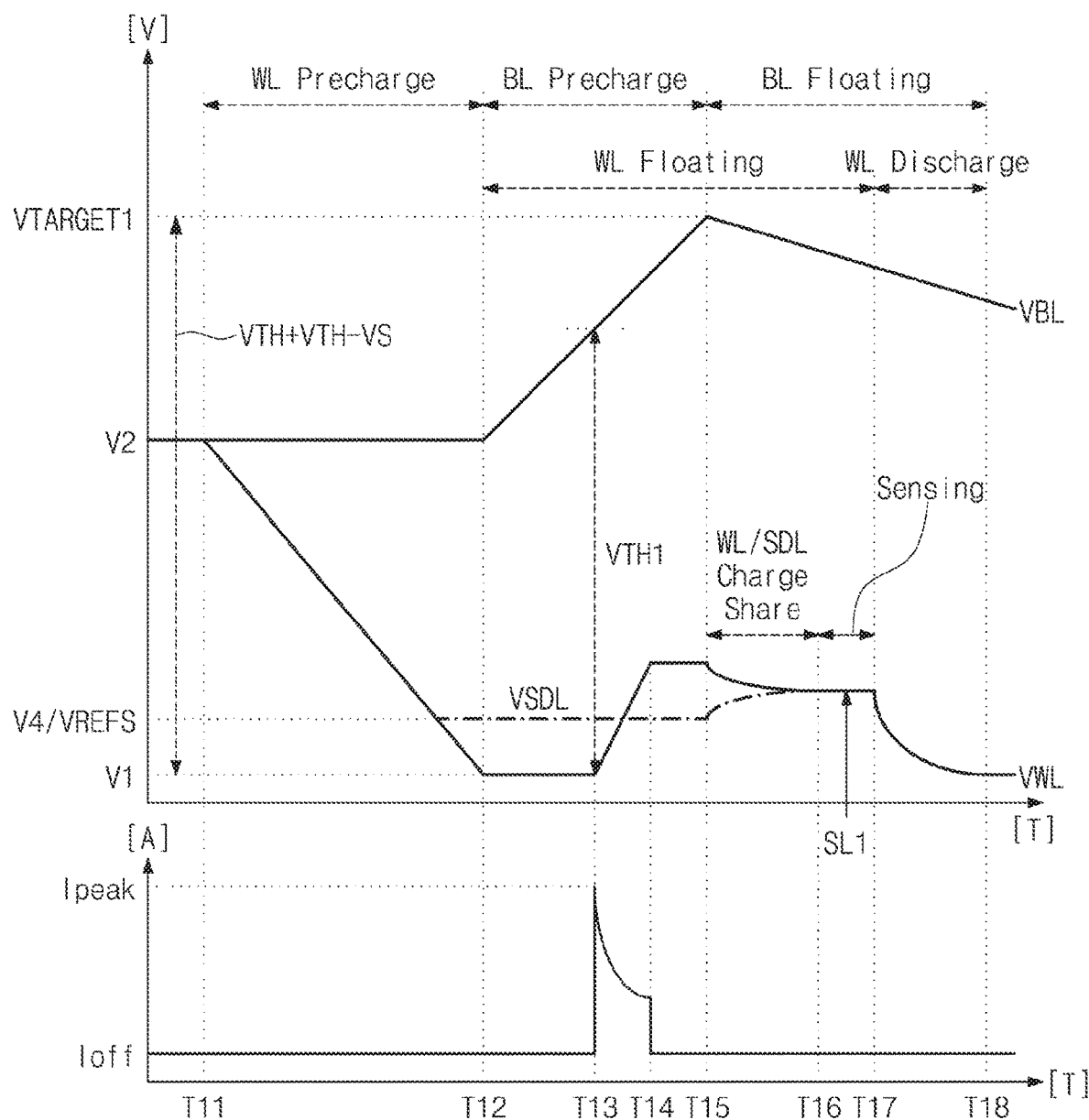
FIG. 8 illustrates an exemplary voltage and current of a memory cell having a relatively small threshold voltage, which vary depending on the flowchart of FIG. 7.
Figure 9:
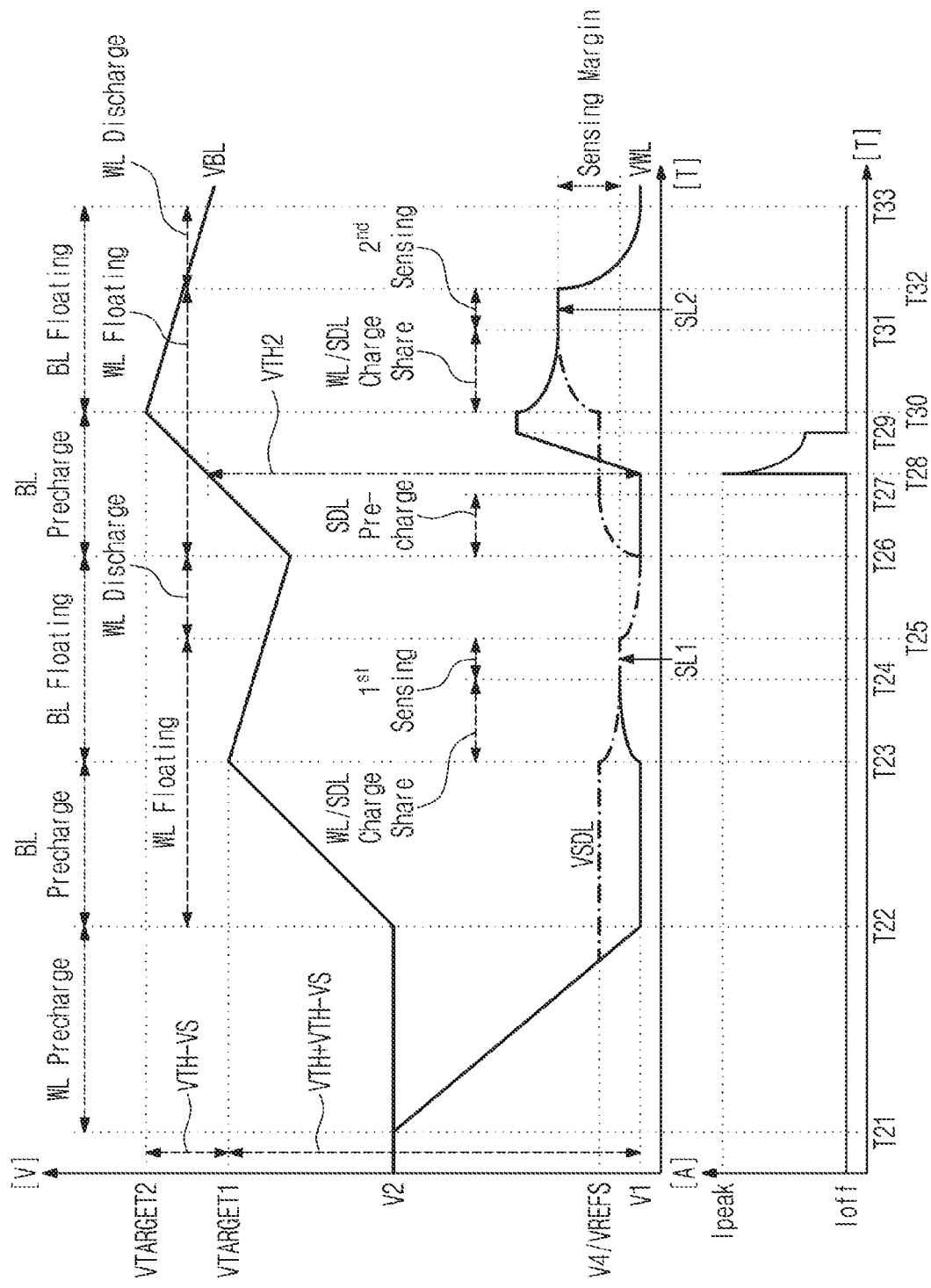
FIG. 9 illustrates an exemplary voltage and current of a memory cell having a relatively great threshold voltage, which vary depending on the flowchart of FIG. 7.

FIG. 7 illustrates a flowchart of an operating method of a memory device of FIG. 1 for avoiding a multi-turn on of a memory cell according to an exemplary embodiment of the inventive concept. FIG. 8 illustrates an exemplary voltage and current of a memory cell having a relatively small threshold voltage, which vary depending on the flowchart of FIG. 7. FIG. 9 illustrates an exemplary voltage and current of a memory cell having a relatively great threshold voltage, which vary depending on the flowchart of FIG. 7. In an exemplary embodiment, the threshold voltage VTH1 of FIG. 8 and the threshold voltage VTH2 of FIG. 9 belong to the same state indicating the same digital logical value. In operation S105, the read control circuit 150 starts (or initiates) a read operation with respect to the memory cell 110. In an exemplary embodiment, operation S105 and operation S110 to operation S150 are performed in response to one read command that is provided to the memory device 100 from the outside (e.g., a memory controller or a host).

In operation S110, the read control circuit 150 sets a target level VTARGET. In an exemplary embodiment of the inventive concept, the target level VTARGET is set based on the threshold voltage VTH and the switching voltage VS of the memory cell 110. For example, the target level VTARGET may be set to a level lower than a level of "VTH+(VTH−VS)" (i.e., may be set to less than the level of "VTH+(VTH−VS)"). In an exemplary embodiment of the inventive concept, the target level VTARGET is set to avoid a multi-turn on of the memory cell 110 in one read operation. It is assumed that the memory cell 110 has the threshold voltage VTH1 of FIG. 5. As described above, the memory cell 110 is turned on at the time T3 and is turned on at the time T5. A level of the bit line voltage VBL at the time T5 may be "VTH1+(VTH1−VS1)". In an exemplary embodiment, the target level VTARGET is set to a level lower than the level of "VTH1+(VTH1−VS1)" so that the memory cell 110 is not turned on at the time T5. Also, the memory device 100 may include one or more memory cells 110. In an exemplary embodiment of the inventive concept, the target level VTARGET is set to a sum of a minimum value Min(VTH) of threshold voltages of the memory cells 110 having the same digital logical values and a minimum value Min (VTH−VS) of differences between the threshold voltages and switching voltages or is set to a level smaller than the sum.

In operation S115, the row driver 130 drives or precharges the word line WL to the precharge level V1. The row driver 130 drives the word line WL having the initial level V2 to the precharge level V1 during a word line precharge period from a time T11 to a time T12 of FIG. 8. The row driver 130 drives the word line WL having the initial level V2 to the precharge level V1 during the word line precharge period from a time T21 to a time T22 of FIG. 9. In operation S115, the row driver 130 drives or precharges a sensing data line SDL to a precharge level V4. The sensing data line SDL may be connected to the sense amplifier 140, the word line WL may be connected to the memory cell 110, and the sensing data line SDL and the word line WL may be electrically connected by a row decoder 270 of FIG. 12 during a charge sharing period to be described below.

In operation S120, the row driver 130 floats or does not drive the word line WL driven to the precharge level V1. The word line WL may be floated during a word line floating period from the time T12 to a time T17 of FIG. 8. The word line WL may be floated during a word line floating period from the time T22 to a time T25 of FIG. 9. In the row decoder 270 to be described with reference to FIG. 12, a switch connected to the word line WL from among switches SW1 to SW4 may disconnect the word line WL from the row driver 130 under control of the read control circuit 150, and thus, the word line WL may be floated by the switch.

In operation S125, the column driver 120 drives or precharges the bit line BL from the initial level V2 to the target level VTARGET. The column driver 120 drives the bit line BL having the initial level V2 to a target level VTARGET1 during a bit line precharge period from the time T12 to a time T15 of FIG. 8. A voltage difference between the bit line voltage VBL and the word line voltage VWL may reach the threshold voltage VTH1 of the memory cell 110 at a time T13, a voltage across the memory cell 110 may be the threshold voltage VTH1 or greater (or exceed the threshold voltage VTH1), and the memory cell 110 is turned on. At the time T13, a peak current Ipeak flows through the memory cell 110. From the time T11 to the time T13, the memory cell 110 is turned off, and a current flowing through the memory cell 110 is the off current Ioff that is very small. Because the word line WL is floated from the time T12 to the time T13, the word line voltage VWL may gradually increase due to the off current Ioff. However, for convenience of illustration, the word line voltage VWL is illustrated as being uniform. Since the word line voltage VWL increases after time T13, a magnitude of the voltage across the memory cell 110 decreases, and a current flowing through the memory cell 110 decreases from the peak current Ipeak. At a time T14, the voltage across the memory cell 110 may reach the switching voltage VS1, the off current Ioff flows through the memory cell 110, and the memory cell 110 is turned off. A time interval from the time T13 to the time T14 is exaggeratedly illustrated to show a decrease of the peak current Ipeak.

The column driver 120 drives the bit line BL from the initial level V2 to the target level VTARGET1 during a bit line precharge period from the time T22 to a time T23 of FIG. 9. Because the threshold voltage VTH2 of the memory cell 110 of FIG. 9 is greater than the threshold voltage VTH1 of the memory cell 110 of FIG. 8, during the bit line precharge period, the memory cell 110 of FIG. 8 is turned on, while the memory cell 110 of FIG. 9 is turned off. From a time T21 to the time T23, the memory cell 110 is turned off, and a current flowing through the memory cell 110 is the off current Ioff that is very small. Because the word line WL is floated from the time T22 to the time T23, the word line voltage VWL may gradually increase due to the off current Ioff. However, for convenience of illustration, the word line voltage VWL is illustrated as being uniform.

For example, the word line precharge period and the bit line precharge period do not overlap each other as illustrated in FIGS. 8 and 9. However, the inventive concept is not limited thereto. In another example, the word line precharge period and the bit line precharge period overlap each other.

For example, a capacitance of the word line WL of FIG. 1 may be smaller than a capacitance of the bit line BL of FIG. 1. In an exemplary embodiment, a speed (rate) at which the word line WL is precharged by the row driver 130 during the word line precharge period from the time T11 to the time T12 is faster than a speed (rate) at which the bit line BL is precharged by the column driver 120 during the bit line precharge period from the time T12 to the time T15. Similar the above description, in an exemplary embodiment, a speed at which the word line WL is precharged by the row driver 130 during the word line precharge period from the time T21 to the time T22 is faster than a speed at which the bit line BL is precharged by the column driver 120 during the bit line precharge period from the time T22 to the time T23.

In operation S130, the column driver 120 floats the bit line BL driven to the target level VTARGET or decreases a voltage level of the bit line BL driven to the target level VTARGET. While only one memory cell 110 is illustrated in FIG. 1, the number of memory cells 110 connected to the bit line BL1 of FIG. 1 may be one or more. For example, the memory cell 110 illustrated in FIG. 1 may be a selected memory cell in a read operation, and the remaining memory cells (not illustrated in FIG. 1) connected to the bit line BL may be unselected memory cells (i.e., other memory cells not involved in the read operation). Because the selected memory cell and the unselected memory cells are connected in common to the bit line BL of FIG. 1, the initial level V2 of the word line WL and the target level VTARGET of the bit line BL may be applied to opposite ends of each of the unselected memory cells. A voltage across each unselected memory cell may be smaller than a voltage across the selected memory cell, but the off current Ioff may flow through the unselected memory cells due to the voltage across each unselected memory cell. As the number of unselected memory cells increases, the amount of off current Ioff may also increase. In this case, the bit line voltage VBL may be changed or decreased. During a bit line floating period after the time T15 of FIG. 8, the column driver 120 floats the bit line BL or decreases the bit line voltage VBL. During the bit line floating period from the time T23 to a time T26 of FIG. 9, the column driver 120 floats the bit line BL or decreases the bit line voltage VBL. The memory cell 110 of FIG. 8 is turned on at the time T13 but is not turned on again at the time T15.

In a column decoder 260 to be described with reference to FIG. 12, a switch connected to the bit line BL from among switches SW5 to SW8 may disconnect the bit line BL from the column driver 120 under control of the read control circuit 150, and thus, the bit line BL may be floated by the switch.

In operation S135, the word line WL and the sensing data line SDL are electrically connected, and thus, the charge sharing may be made (occur) between the word line WL and the sensing data line SDL. During the charge sharing period WL/SDL Charge Share from the time T15 to a time T16 of FIG. 8, the charge sharing may be made between the word line WL and the sensing data line SDL. During the charge sharing period WL/SDL Charge Share from the time T23 to a time T24 of FIG. 9, the charge sharing may be made between the word line WL and the sensing data line SDL. Since the charge sharing occurs, a voltage level of the word line WL and a voltage level of the sensing data line SDL may be the same or identical.

In operation S135, the sense amplifier 140 may be enabled by the read control circuit 150 after the target level VTARGET is applied to the memory cell 110 and may sense a sensing level (i.e., the word line voltage VWL) of the sensing data line SDL. For example, the read control circuit 150 may provide an enable signal for enabling or triggering the sense amplifier 140. The sense amplifier 140 may compare the sensing level with a reference level VREFS. For example, the reference level VREFS may be present in a sensing margin corresponding to a difference between sensing levels SL1 and SL2 of FIG. 9. An example is illustrated in FIGS. 8 and 9 where the reference level VREFS is equal to the precharge level V4 of the sensing data line SDL, but the reference level VREFS may be different from the precharge level V4 of the sensing data line SDL. The sense amplifier 140 may sense the sensing level SL1 during a sensing period from the time T16 to the time T17 of FIG. 8. The sense amplifier 140 may sense the sensing level SL1 during a sensing period "1$^{st}$ sensing" from the time T24 to the time T25 of FIG. 9. The sensing level SL1 of FIG. 8 may be determined (or formed) after the memory cell 110 is turned on at the time T13, and the sensing level SL1 of FIG. 9 may be determined after the bit line precharge period from the time T22 to the time T23, in which the memory cell 110 is not turned on. The sensing level SL1 of the sensing period from the time T16 to the time T17 of FIG. 8 may be different from or higher than the sensing level SL1 of the sensing period "1$^{st}$ sensing" from the time T24 to the time T25 of FIG. 9. The sense amplifier 140 may provide the sensing result of operation S135 to the read control circuit 150.

In operation S135, the row driver 130 discharges or drive the word line WL to the precharge level V1 after the sensing period (or after the sensing level SL1 is sensed by the sense amplifier 140). The row driver 130 may discharge the word line WL to the precharge level V1 during a word line discharge period from the time T17 to a time T18 of FIG. 8. The row driver 130 may discharge the word line WL to the precharge level V1 during a word line discharge period from the time T25 to the time T26 of FIG. 9. In an exemplary embodiment, a speed at which the word line WL is discharged during the word line discharge period from the time T17 to the time T18 of FIG. 8 and from the time T25 to the time T26 of FIG. 9 is slower than a speed at which a voltage level of the bit line BL decreases during the bit line floating period. Accordingly, even though the word line WL is discharged, a magnitude of a voltage across the memory cell 110 during the word line discharge period does not increase, and thus, a multi-turn on of the memory cell 110 may be avoided.

For example, the row driver 130 discharges the sensing data line SDL to the precharge level V1 as illustrated in FIGS. 8 and 9. However, the inventive concept is not limited thereto. In another example, the row driver 130 does not discharge the sensing data line SDL to the precharge level V1 unlike the examples illustrated in FIGS. 8 and 9.

The number of memory cells 110 connected to the word line WL of FIG. 1 may be one or more. For example, the memory cell 110 illustrated in FIG. 1 may be a selected memory cell in a read operation, and the remaining memory cells (not illustrated in FIG. 1) connected to the word line WL may be unselected memory cells. Because the selected memory cell and the unselected memory cells are connected in common to the word line WL of FIG. 1, the precharge level V1 of the word line WL and the initial level V2 of the bit line BL may be applied to opposite ends of each of the unselected memory cells. A voltage across each unselected memory cell may be smaller than a voltage across the selected memory cell, but the off current Ioff may flow through the unselected memory cells due to the voltage across each unselected memory cell. As the number of unselected memory cells increases, the amount of off current Ioff may also increase. In this case, the word line voltage VWL may be changed or decreased. The change of the word line voltage VWL due to the off current Ioff flowing through the unselected memory cells may be removed by discharging the word line voltage VWL to the precharge level V1 in operation S135. Through operation S135, the sensing margin of the memory cell 110 may be improved.

In operation S140, the read control circuit 150 determines whether the memory cell 110 is in the SET state (i.e., the memory cell 110 is turned on by the target level VTARGET and the precharge level V1 set in operation S110) or whether the memory cell 110 is in the RESET state (i.e., the memory cell 110 is turned off by the target level VTARGET and the precharge level V1 set in operation S110), based on the sensing result of the sense amplifier 140. A sensing result of the sense amplifier 140 that senses the sensing level SL1 determined during the charge sharing period after the memory cell 110 is turned on at the time T13 of FIG. 8 is different from a sensing result of the sense amplifier 140 that senses the sensing level SL1 determined during the charge sharing period without the turn-on of the memory cell 110 from the time T22 to the time T23 of FIG. 9.

When the memory cell 110 is turned on by the target level VTARGET set in operation S110 (Y), in operation S145, the read control circuit 150 terminates the read operation of the memory cell 110. In the case of FIG. 8, the read control circuit 150 may identify (check) that the sensing result of the sense amplifier 140 indicates the turn-on of the memory cell 110 at the time T13 or that the sensing level SL1 is higher than the reference level VREFS at the time T13 and may terminate the read operation of the memory cell 110. FIGS. 5 and 8 showing the read operations associated with the memory cells 110 having the same threshold voltage VTH1 are compared. In FIG. 5, the memory cell 110 is turned on two times at the time T3 and the time T5 while the bit line voltage VBL increases to the level V3 by the column driver 120. In contrast, in FIG. 8, the memory cell 110 is turned on once at the time T13 while the bit line voltage VBL increases to the target level VTARGET (lower than level V3) by the column driver 120. Afterwards, the read control circuit 150 may terminate the read operation associated with the memory cell 110 based on a sensing result of the sense amplifier 140 that senses the sensing level SL1 and may control the column driver 120 and the row driver 130 so that a voltage is not applied to the memory cell 110 any more. Compared with FIG. 5, in FIG. 8, the multi-turn on of the memory cell 110 is avoided through operation S105 to operation S145.

When the memory cell 110 is not turned on by the target level VTARGET set in operation S110 (N), in operation S150, the read control circuit 150 adjusts (or changes) the target level VTARGET. In operation S150, the read control circuit 150 may increase the target level VTARGET as much as a difference between the threshold voltage VTH and the switching voltage VS of the memory cell 110. The memory device 100 may include one or more memory cells 110, and the increment of the target level VTARGET may be a minimum value Min(VTH–VS) of differences between threshold voltages and switching voltages. The read control circuit 150 may control the column driver 120 to adjust the target level VTARGET. The read control circuit 150 may control the column driver 120, the row driver 130, and the sense amplifier 140 to again perform operation S115 to operation S135. In the case of FIG. 9, the read control circuit 150 may identify that the sensing result of the sense amplifier 140 indicates the turn-off of the memory cell 110 or that the sensing level SL1 is lower than the reference level VREFS and may again perform operation S150 and operation S115 to operation S140. In operation S150, the read control circuit 150 may adjust the target level VTARGET1 to a target level VTARGET2. For example, the target level VTARGET2 may be a level that is lower than a level of "VTH+(VTH–VS)+(VTH–VS)". In an exemplary embodiment, the VTARGET2 is higher than the target level VTARGET1.

In operation S115, the row driver 130 may drive or precharge the sensing data line SDL to the precharge level V4 during a sensing data line precharge period from the time T26 to a time T27. In the read operation, the word line WL is driven to the precharge level V1 when operation S115 is first performed, but the word line WL is already discharged in operation S135 when operation S115 is again performed. In operation S120, the row driver 130 floats the word line WL discharged to the precharge level V1 during the word line floating period from the time T26 to a time T32.

In operation S125, the column driver 120 may drive the bit line BL to the target level VTARGET2 higher than the target level VTARGET1 during the bit line precharge period from the time T26 to a time T30 of FIG. 9. A voltage difference between the bit line voltage VBL and the word line voltage VWL may reach the threshold voltage VTH2 of the memory cell 110 at a time T28, a voltage across the memory cell 110 may be the threshold voltage VTH2 or greater (or exceed the threshold voltage VTH2), and the memory cell 110 is turned on. At the time T28, a peak current Ipeak flows through the memory cell 110. From the time T26 to the time T28, the memory cell 110 is turned off, and a current flowing through the memory cell 110 is the off current Ioff that is very small. Because the word line WL is floated from the time T26 to the time T28, the word line voltage VWL may gradually increase due to the off current Ioff. However, for convenience of illustration, the word line voltage VWL is illustrated as being uniform. Since a voltage VWL of the word line connected to the memory cell 110 increases after the time T28, a magnitude of the voltage across the memory cell 110 decreases, and a current flowing through the memory cell 110 decreases from the peak current Ipeak. At a time T29, the voltage across the memory cell 110 may reach the switching voltage VS2, the off current Ioff flows through the memory cell 110, and the memory cell 110 is turned off. A time period from the time T28 to the time T29 is exaggeratedly illustrated to show a decrease of the peak current Ipeak and may be very short.

In operation S130, during the bit line floating period from the time T30 to a time T33, the column driver 120 floats the bit line BL driven to the target level VTARGET2 or decreases a voltage level of the bit line BL driven to the target level VTARGET2. Even though the bit line voltage VBL reaches the target level VTARGET2, a level of the bit line voltage VBL is lower than the target level VTARGET2.

In operation S135, during the charge sharing period from the time T30 to a time T31, the word line WL and the sensing data line SDL are electrically connected, and thus, the charge sharing may be made between the word line WL and the sensing data line SDL. In operation S135, the sense amplifier 140 may sense the sensing level SL2 during a sensing period "$2^{nd}$ sensing" from the time T31 to the time T32. The sensing level SL2 of the sensing period "$2^{nd}$ sensing" may be determined after the memory cell 110 is turned on at the time T28, and the sensing level SL1 of the sensing period "$1^{st}$ sensing" may be determined after the bit line precharge period from the time T22 to the time T23, in which the memory cell 110 is not turned on. For example, a difference between the sensing level SL1 of the sensing period "$1^{st}$ sensing" and the sensing level SL2 of the sensing period "$2^{nd}$ sensing" may correspond to a sensing margin of the memory cell 110. The sense amplifier 140 may provide a result of sensing the sensing level SL2 to the read control circuit 150. The process where data of the memory cell 110 are sensed through operation S115 to operation S135 may be referred to as "Q-sensing".

In operation S135, the row driver 130 may discharge the word line WL to the precharge level V1 during the word line discharge period from the time T32 to the time T33. For example, the row driver 130 may also discharge the sensing data line SDL to the precharge level V1 as illustrated in FIG. 9. In another example, the row driver 130 does not discharge the sensing data line SDL to the precharge level V1 unlike the examples illustrated in FIG. 9.

In operation S140, the read control circuit 150 may identify that the sensing result of the sense amplifier 140 indicates the turn-on of the memory cell 110 or that the sensing level SL2 is higher than the reference level VREFS. In operation S145, the read control circuit 150 may terminate the read operation associated with the memory cell 110 and may control the column driver 120 and the row driver 130 so that a voltage is not applied to the memory cell 110 any more. In FIG. 9, the multi-turn on of the memory cell 110 is avoided as operation S150 and operation S115 to operation S140 are repeatedly performed. An example in which operation S150 and operation S115 to operation S140 are repeated once is described with reference to FIGS. 7 and 9. However, the number of times that operation S150 and operation S115 to operation S140 are repeated may be one or more. The target level VTARGET may be increased from an initial level set in operation S110 as much as "r X (VTH−VS)". Here, "r" may indicate the number of times that operation S150 and operation S115 to operation S140 are repeated and may be an integer of 1 or more.

In an exemplary embodiment, the read control circuit 150 turns on the memory cell 110 only once in one read operation associated with the memory cell 110. Under control of the read control circuit 150, the target level VTARGET that is first set to be relatively low may be applied to the bit line BL connected to the memory cell 110. Then, under control of the read control circuit 150, a voltage is not applied to the memory cell 110 any more when the memory cell 110 is turned on, or the target level VTARGET may stepwise increase as much as a difference between the threshold voltage VTH and the switching voltage VS of the memory cell 110 when the memory cell 110 is not turned on. Afterwards, under control of the read control circuit 150, the increased target level VTARGET may be applied to the bit line BL connected to the memory cell 110. The read control circuit 150 may perform a read operation on the memory cell 110 while stepwise increasing the target level VTARGET to be applied to a bit line of the memory cell 110 depending on whether the memory cell 110 is turned on. For example, the stepwise increasing may be performed by applying a series of step pulses to the bit line. Since the target level VTARGET is stepwise increased, the multi-turn on of the memory cell 110 may be avoided during one read operation.

Figure 10:
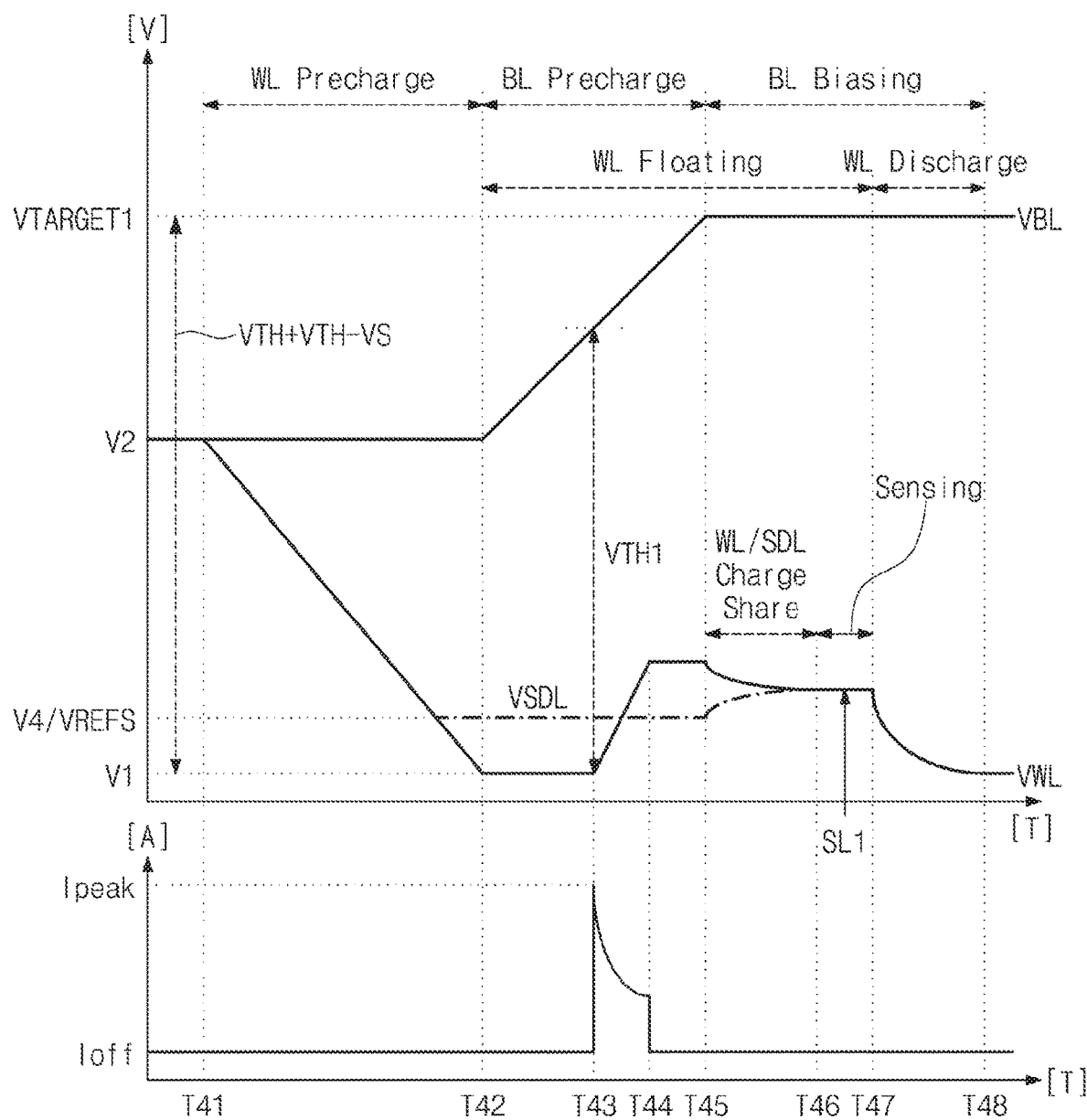
FIG. 10 illustrates an exemplary voltage and current of a memory cell having a relatively small threshold voltage, which vary depending on the flowchart of FIG. 7.
Figure 11:
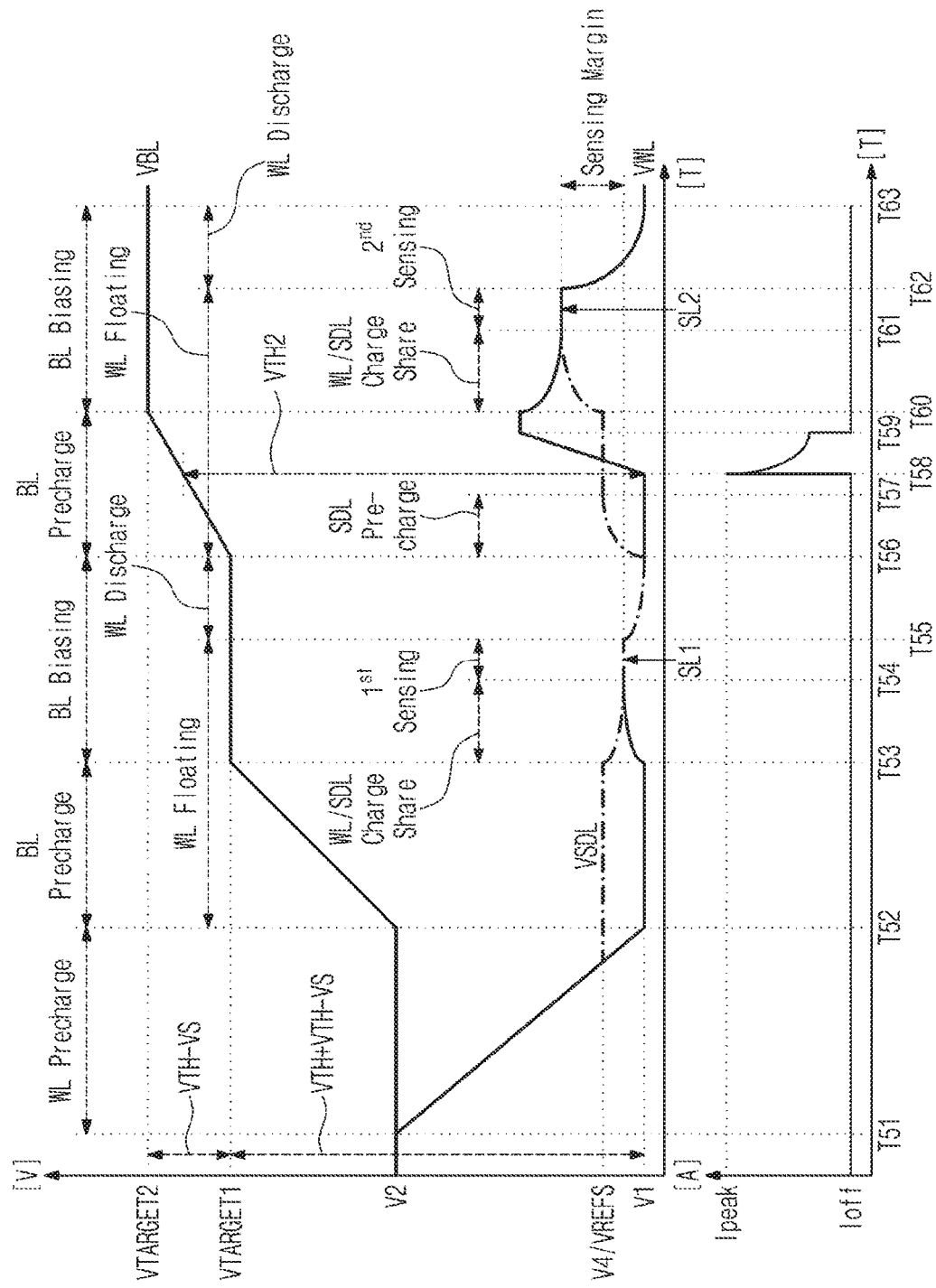
FIG. 11 illustrates an exemplary voltage and current of a memory cell having a relatively great threshold voltage, which vary depending on the flowchart of FIG. 7.

FIG. 10 illustrates an exemplary voltage and current of a memory cell having a relatively small threshold voltage, which vary depending on the flowchart of FIG. 7. FIG. 11 illustrates an exemplary voltage and current of a memory cell having a relatively great threshold voltage, which vary depending on the flowchart of FIG. 7. The below description will be focused on a difference between FIGS. 10 and 8 and a difference between FIGS. 11 and 9. The column driver 120 maintains the bit line BL at the target level VTARGET1 during a bit line biasing period after a time T45 of FIG. 10. The column driver 120 maintains the bit line BL at the target level VTARGET1 during a bit line biasing period from a time T53 to a time T56 of FIG. 11. Also, the column driver 120 maintains the bit line BL at the target level VTARGET2 during a bit line biasing period from a time T60 to a time T63 of FIG. 11. The remaining periods of FIGS. 10 and 11 may be substantially identical to the corresponding periods of FIGS. 8 and 9 except for the above bit line biasing periods.

Figure 12:
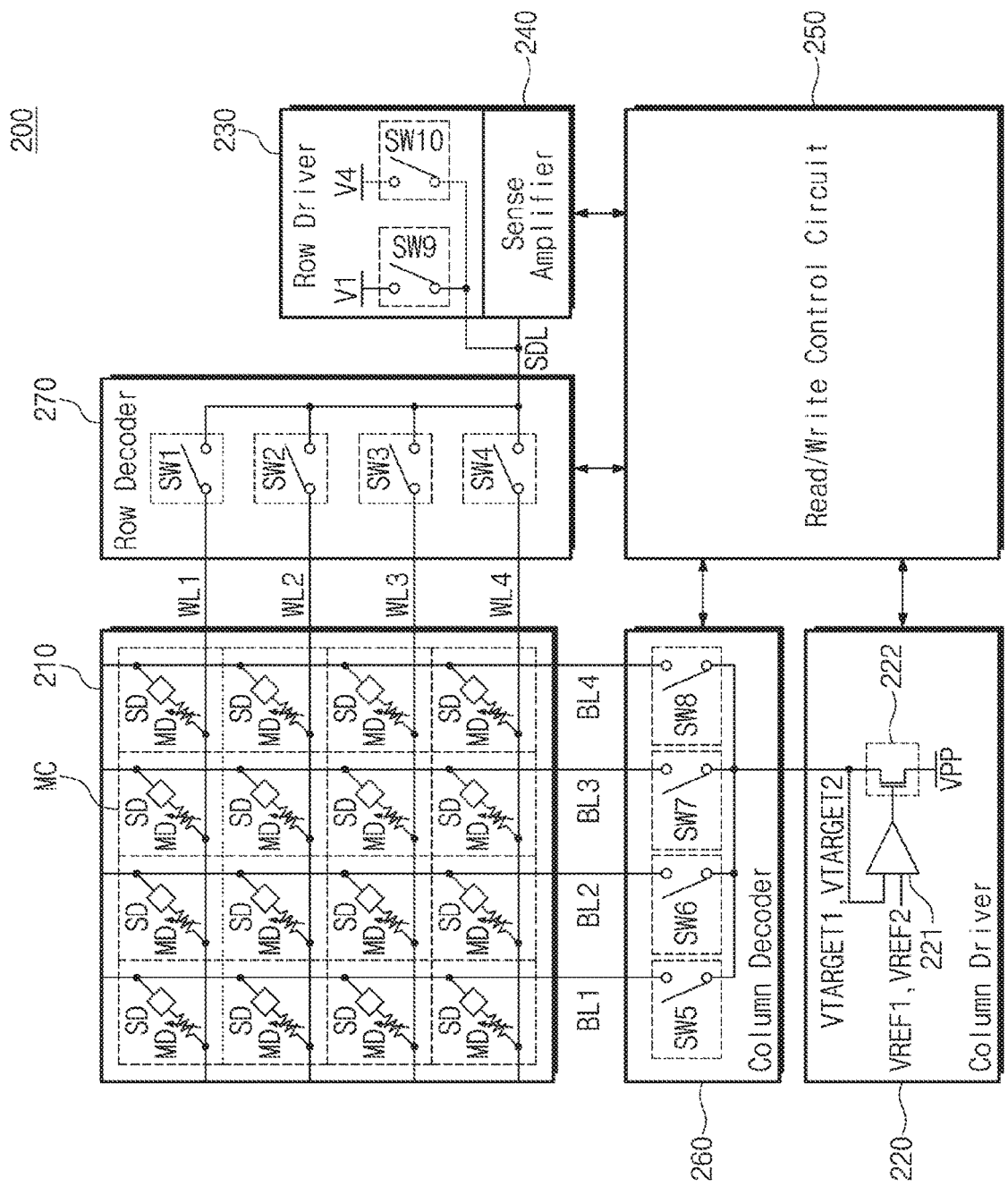

FIG. 12 illustrates a block diagram of a memory device according to an exemplary embodiment of the inventive concept. A memory device 200 includes a memory cell array 210 including memory cells MC, a column driver 220, a row driver 230, a sense amplifier 240, a read/write (read and write) control circuit 250, the column decoder 260, and the row decoder 270. Each of the memory cells MC may be substantially identical to the memory cell 110. The memory cells MC may be connected to the word lines WL1 to WL4 and the bit lines BL1 to BL4. The number of memory cells MC, the number of word lines WL1 to WL4, and the number of bit lines BL1 to BL4 are only an example. Operations of the column driver 220, the row driver 230, the sense amplifier 240, and the read/write control circuit 250 may be substantially identical to the operations of the column driver 120, the row driver 130, the sense amplifier 140, and the read control circuit 150, respectively.

The column driver 220 includes a comparator 221 (e.g., a comparison circuit) and a clamp transistor 222. When the read/write control circuit 250 selects a reference voltage VREF1 in operation S110, the comparator 221 drives the clamp transistor 222 based on a result of comparing the reference voltage VREF1 with the target level VTARGET1. The clamp transistor 222 may output a voltage having the target level VTARGET1 based on the comparison result of the comparator 221 and a power supply voltage VPP. When the read/write control circuit 150 selects a reference voltage VREF2 in operation S150, the comparator 221 drives the clamp transistor 222 based on a result of comparing the reference voltage VREF2 with the target level VTARGET2. The clamp transistor 222 may output a voltage having the target level VTARGET2 based on the comparison result of the comparator 221 and the power supply voltage VPP. While it is described that the column driver 220 outputs a voltage having one of the two target levels VTARGET1 and VTARGET2, the column driver 220 may output a voltage having one of a minimum level of the target level VTARGET, a maximum level of the target level VTARGET, and intermediate level(s) between the minimum level and the minimum level, depending on the number of times that operation S150 and operation S115 to operation S140 are repeated. Under control of the read/write control circuit 250, the column driver 220 may further output a non-selection bit line voltage to be applied to an unselected bit line of the bit lines BL1 to BL4, an initial bit line voltage having an initial level (e.g., V2 of FIGS. 8 and 9), a program bit line voltage to be applied to a selected bit line, etc.

The row driver 230 is connected to the sensing data line SDL. The row driver 230 includes switches SW9 and SW10. The row driver 230 outputs a voltage having the precharge level V1 that is used to precharge or discharge the word lines WL1 to WL4 through the switch SW9, under control of the read/write control circuit 250. The row driver 230 outputs a voltage having the precharge level V4 that is used to precharge or discharge the sensing data line SDL through the switch SW10, under control of the read/write control circuit 250. Under control of the read/write control circuit 250, the row driver 230 may further output a non-selection word line voltage to be applied to an unselected word line of the word lines WL1 to WL4, an initial word line voltage having an initial level (e.g., V2 of FIGS. 8 and 9), a program word line voltage to be applied to a selected word line, etc. The row driver 230 may provide the row decoder 270 with the above voltages through the sensing data line SDL or another line not illustrated.

The sense amplifier 240 may be connected to the sensing data line SDL. The sense amplifier 240 may sense a level of the sensing data line SDL to determine a sensing result and may provide the sensing result to the read/write control circuit 250. Because the charge sharing is made (occurs) between a (selected) word line WL and the sensing data line SDL in operation S135, a level of the sensing data line SDL may be identical to a level of the selected word line WL.

The read/write control circuit 250 may control the column driver 220, the row driver 230, the sense amplifier 240, the column decoder 260, and the row decoder 270. In a read operation, the read/write control circuit 250 may control levels of voltages to be applied to the selected memory cell MC or the unselected memory cell MC, times when the voltages are applied thereto, the order of applying the voltages thereto, etc. In a write operation, the read/write control circuit 250 may control levels of voltages to be applied to the selected memory cell MC or the unselected memory cell MC, times when the voltages are applied thereto, the order of applying the voltages thereto, etc.

The column decoder 260 includes the switches SW5 to SW8 respectively connected to the bit lines BL1 to BL4. The number of switches SW5 to SW8 illustrated in FIG. 12 is an example. The column decoder 260 may select a switch connected to a selected bit line indicated by a column address from among the switches SW5 to SW8. The read/write control circuit 250 may send the column address to the column decoder 260. The column decoder 260 may apply various voltages output from the column driver 220 to a selected bit line or an unselected bit line.

The row decoder 270 includes switches SW1 to SW4 respectively connected to the word lines WL1 to WL4. The number of switches SW1 to SW4 illustrated in FIG. 12 is an example. The row decoder 270 may select a switch connected to a selected word line indicated by a row address from among the switches SW1 to SW4. The read/write control circuit 250 may send the row address to the row decoder 270. The selected switch may electrically connect the selected word line indicated by the row address and the sensing data line SDL. The memory cell MC connected to the selected bit line and the selected word line may be referred to a "selected memory cell MC". The row decoder 270 may apply various voltages output from the row driver 230 to a selected word line or an unselected word line.

Figure 13:
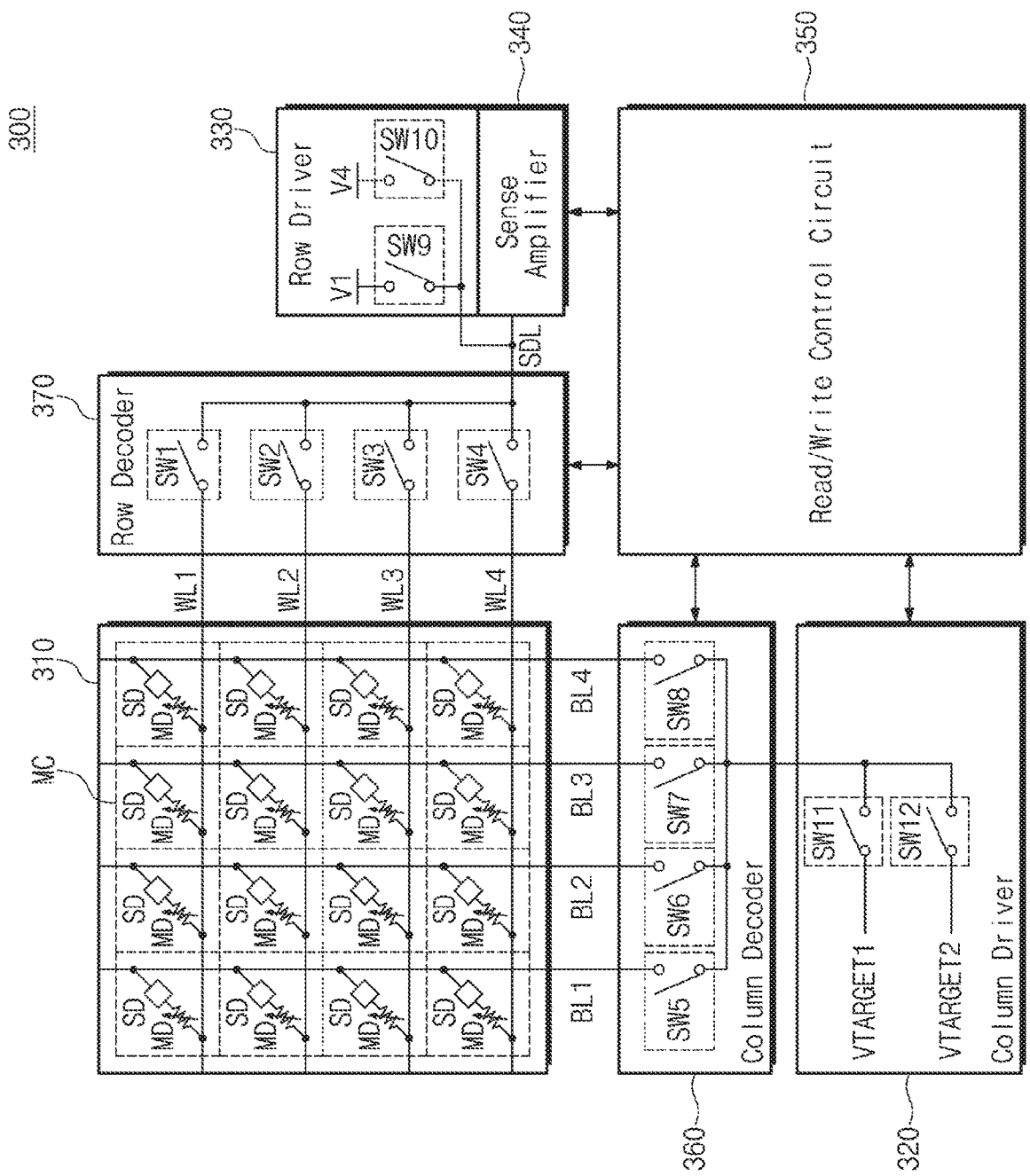

FIG. 13 illustrates a block diagram of a memory device according to an exemplary embodiment of the inventive concept. A memory device 300 includes a memory cell array 310 including memory cells MC, a column driver 320, a row driver 330, a sense amplifier 340, a read/write control circuit 350, a column decoder 360, and a row decoder 370. The components 310 and 330 to 370 of the memory device 300 may be substantially identical to the components 210 and 230 to 270 of the memory device 200. The column driver 320 includes switches SW11 and SW12. The column driver 320 may output a voltage having the target level VTARGET1 through (by using) the switch SW11. The column driver 320 may output a voltage having the target level VTARGET2 through (by using) the switch SW12. In both FIG. 12 and FIG. 13, the column driver 320 may output a voltage having target levels VTARGET1, VTARGET2, VTARGET3, etc., a voltage having an initial level, a non-selection bit line voltage, a program bit line voltage, etc.

In an embodiment, the switches SW1 to SW4, SW5 to SW8, SW9 to SW10, and SW11 to SW12 illustrated in FIGS. 12 and 13 may be implemented with transistors (e.g., an NMOS transistor, a PMOS transistor, or a combination thereof).

Figure 14:
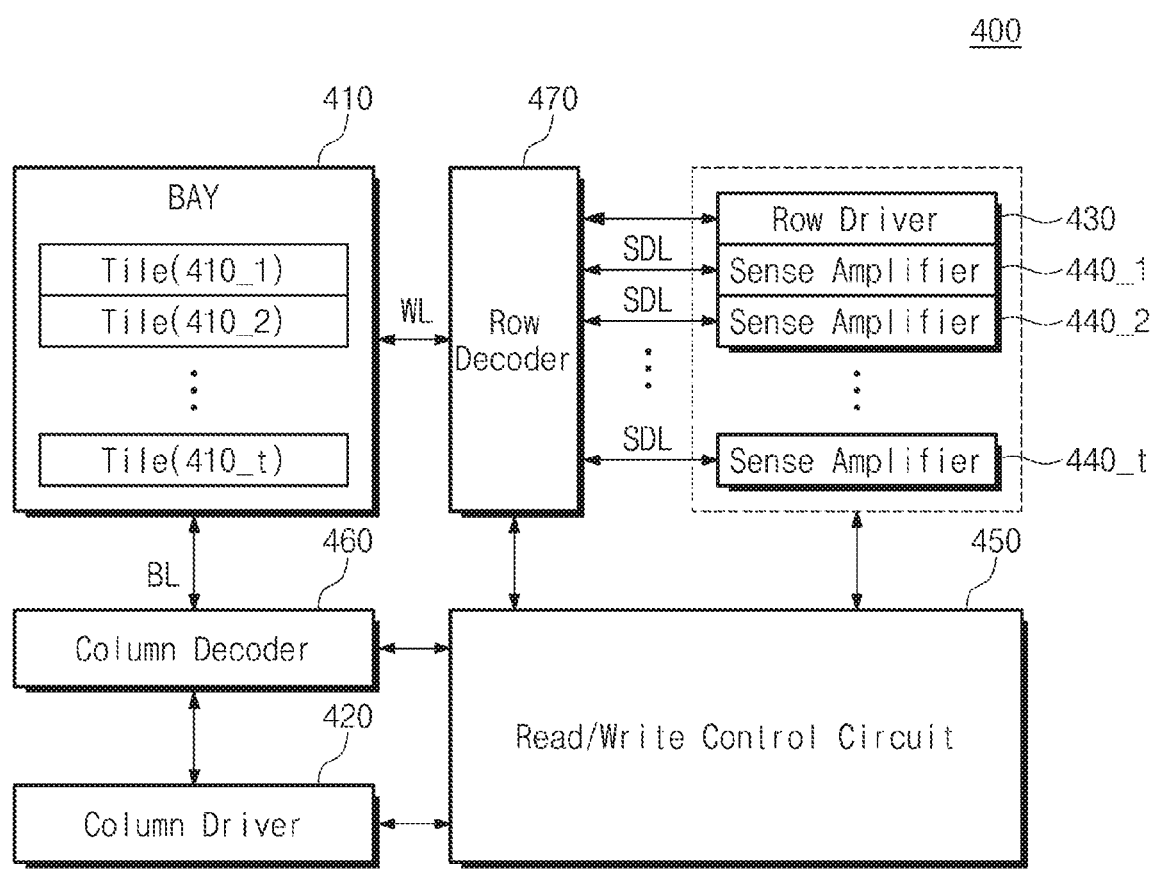

FIG. 14 illustrates a block diagram of a memory device according to an exemplary embodiment of the inventive concept. A memory device 400 includes a bay 410, a column driver 420, a row driver 430, sense amplifiers 440_1 to 440_t, a read/write control circuit 450, a column decoder 460, and a row decoder 470. The column driver 420, the row driver 430, each of the sense amplifiers 440_1 to 440_t, the read/write control circuit 450, the column decoder 460, and the row decoder 470 may be implemented to be the same as the column driver 220 or 320, the row driver 230, the sense amplifier 240, the read/write control circuit 250, the column decoder 260, and the row decoder 270, respectively.

A plurality of memory cells (refer to MC of FIGS. 12 and 13) of the memory device 400 may constitute the bay 410. The bay 410 may include a plurality of memory cells and may be divided into one or more tiles 410_1 to 410_t (t being an integer of 2 or more). Each of the one or more tiles 410_1 to 410_t may include a plurality of memory cells. For example, in each of the one or more tiles 410_1 to 410_t, the number of word lines connected to memory cells may be 4K ($=2^{12}$) or more (or may exceed 4K), and the number of bit lines connected to memory cells may be 2K ($=2^{11}$) or more (or may exceed 2K). However, the inventive concept is not limited to the above numerical values. Unlike the memory devices 200 and 300, the memory device 400 includes the sense amplifiers 440_1 to 440_t as much as the number of tiles 410_1 to 410_t included in the one bay 410. The sense amplifier 440_1 may sense data of a memory cell in the tile 410_1 through the word line WL and the sensing data line SDL to determine a sensing result and may provide the sensing result to the read/write control circuit 450. Operations of the sense amplifiers 440_2 to 440_t may be similar to the operation of the sense amplifier 440_1.

For example, one memory cell MC may be selected for each bay 410 in a read operation or a write operation. The column driver 420, the column decoder 460, and the row decoder 470 may apply various voltages necessary for the read operation or the write operation under control of the read/write control circuit 450. A sense amplifier, which corresponds to a tile where a selected memory cell is located, from among the sense amplifiers 440_1 to 440_t may sense data of the selected memory cell and may provide the sensing result to the read/write control circuit 450. One or more memory cells MC may be selected for each bay 410 in the read operation or the write operation.

FIG. 15 illustrates a block diagram of a memory device according to an exemplary embodiment of the inventive concept. A memory device 500 includes a layer L1 and a layer L2 located, disposed, or stacked on the layer L1. A vertical relationship of the layers L1 and L2 may be interchanged. The memory cells MC described with reference to FIGS. 1 to 14 may be arranged in the layer L2. The memory cells MC arranged in the layer L2 may constitute a bank 510. The bank 510 may include a plurality of bays 511. The bay 511 may correspond to the bay 410 of FIG. 14 and may include the memory cell MC connected to the word line WL and the bit line BL. The number of memory cells MC, the number of bays 511, and the number of banks 510 are only an example.

Bay control circuits 520 may be disposed in the layer L1. The bay control circuits 520 control the bays 511 disposed in the layer L2, respectively. For example, in a plan view, the bay control circuit 520 and the bay 511 controlled by the bay control circuit 520 overlap each other. The bay control circuit 520 includes a column driver 522, a row driver 523, sense amplifiers 524, a read/write control circuit 525, a column decoder 526 (e.g., a decoding circuit), and a row decoder 527 (e.g., a decoding circuit). The components 522 to 527 of the bay control circuit 520 may be substantially identical to the respective components 420 to 470 of the memory device 400 of FIG. 14.

The memory device 500 includes a command decoder 531 (e.g., a decoding circuit), an address buffer 532, a data processing circuit 533, an error correction circuit (ECC) 534, an on cell counter (OCC) 535 (e.g., a counting circuit), a randomizer 536, registers 537, and a voltage generator 538. The components 531 to 538 may be included in a peripheral circuit of the memory device 500, and the peripheral circuit may be disposed in the layer L1. A structure where the memory cells MC are disposed in the layer L2 and circuits 520 and 531 to 538 for controlling the memory cells MC are disposed in the layer L1 may be referred to as a "cell on peri (COP)".

The command decoder 531 may receive a command CMD from the outside (e.g., a host or a memory controller) of the memory device 500. The command decoder 531 may decode the command CMD to generate a decoding result and may control the remaining components 511, 520, and 532 to 538 of the memory device 500 based on the decoding result. For example, the command CMD may include a read command or write command for the memory cell MC. The bay control circuit 520 may perform operation S105 to operation S150 under control of the command decoder 531 that decodes the read command once.

The address buffer 532 may receive an address ADD from the outside of the memory device 500. The address ADD may indicate at least one or more memory cells to be selected from the memory cells of the memory device 500. The address buffer 532 may provide a column address to the column decoder 526 of the bay control circuit 520 controlling the bay 511 including the memory cell MC that the address ADD indicates, and may provide a row address to the row decoder 527 of the bay control circuit 520 controlling the bay 511 including the memory cell MC that the address ADD indicates. The command decoder 531 may select the bay control circuit 520 controlling the bay 511 including the memory cell MC that the address ADD indicates. For example, the command decoder 531 that receives one of a read command and a write command may simultaneously select one or more bay control circuits 520.

The data processing circuit 533 may receive data "DATA" including write data from the outside of the memory device 500. The data processing circuit 533 may provide the write data to the selected bay control circuits 520. In each of the selected bay control circuits 520, the read/write control circuit 525 may control the remaining components 522 to 527 to write the write data in the selected memory cell MC. The data processing circuit 533 may receive read data from the selected bay control circuits 520. The data processing circuit 533 may output the data "DATA" including the read data. In each of the selected bay control circuits 520, the read/write control circuit 525 may control the remaining components 522 to 527 to read the read data from the selected memory cell MC.

The error correction circuit 534 may perform an encoding operation on write data to be written in the selected memory cell MC based on an error correction code. The error correction circuit 534 may perform a decoding operation on read data read from the selected memory cell MC based on the error correction code. The error correction circuit 534 may detect an error of the read data, may calculate an error count (e.g., the number of error (or fail) bits) of the read data, may determine whether the error of the read data is correctable, or may correct the error of the read data. The error correction circuit 534 may provide the error count of the read data to the data processing circuit 533. For example, the data processing circuit 533 may provide write data encoded by the error correction circuit 534 to the selected bay control circuits 520. The data processing circuit 533 may output the data "DATA" including read data decoded by the error correction circuit 534.

The on cell counter 535 may calculate the number of turned-on memory cells OCC of the selected memory cells MC based on the read data output from the selected memory cells MC. The on cell counter 535 may provide the number of turned-on memory cells OCC to the data processing circuit 533. In an exemplary embodiment, the on cell counter 535 is not included in the memory device 500. The randomizer 536 may perform a randomization operation on write data to be written in the selected memory cell MC. The randomizer 536 may perform a de-randomization operation on read data read from the selected memory cell MC. For example, when each of the memory cells MC stores one of digital logical values of "0" and "1", the randomizer 536 may adjust a ratio of 1's to 0's of the write data to be written in the selected memory cells MC. The randomizer 536 may calculate a ratio of 1's to 0's of the read data. For example, the randomizer 536 may identify whether the ratio of 1's to 0's of the write data and the ratio of 1's to 0's of the read data are different. The randomizer 536 may provide information about the above ratios to the data processing circuit 533. In an exemplary embodiment, the randomizer 536 is not included in the memory device 500.

The registers 537 may store various information about the memory device 500. For example, the registers 537 may store information about a result of an operation performed by the error correction circuit 534, an error count calculated by the error correction circuit 534, the number of turned-on memory cells OCC calculated by the on cell counter 535, a ratio calculated by the randomizer 536, information of the target level VTARGET set in operation S110 or operation S150, write data, read data, an operating condition, etc.

The voltage generator 538 may generate various voltages to be used in the memory device 500 by using a power supply voltage supplied to the memory device 500, and may provide the generated voltages to the components 510, 520, and 531 to 538 of the memory device 500. The power supply voltage supplied to the memory device 500 may include VDD, VPP, GND, etc. The voltage generator 538 may generate and provide the voltages VREF1, VREF2, V1, V4, VTARGET1, and VTARGET2 illustrated in FIGS. 12 and 13. Also, the various voltages used in the memory device 500 may include voltages having various target levels VTARGET1, VTARGET2, VTARGET3, etc., a voltage having the initial level V2, voltages having the precharge levels V1 and V4, an unselected bit line voltage to be applied to an unselected bit line, an unselected word line voltage to be applied to an unselected word line, a program bit line voltage, a program word line voltage, the reference voltages VREF1 and VREF2, the reference voltage VREFS to be used by the sense amplifiers 524, etc.

Figure 16:
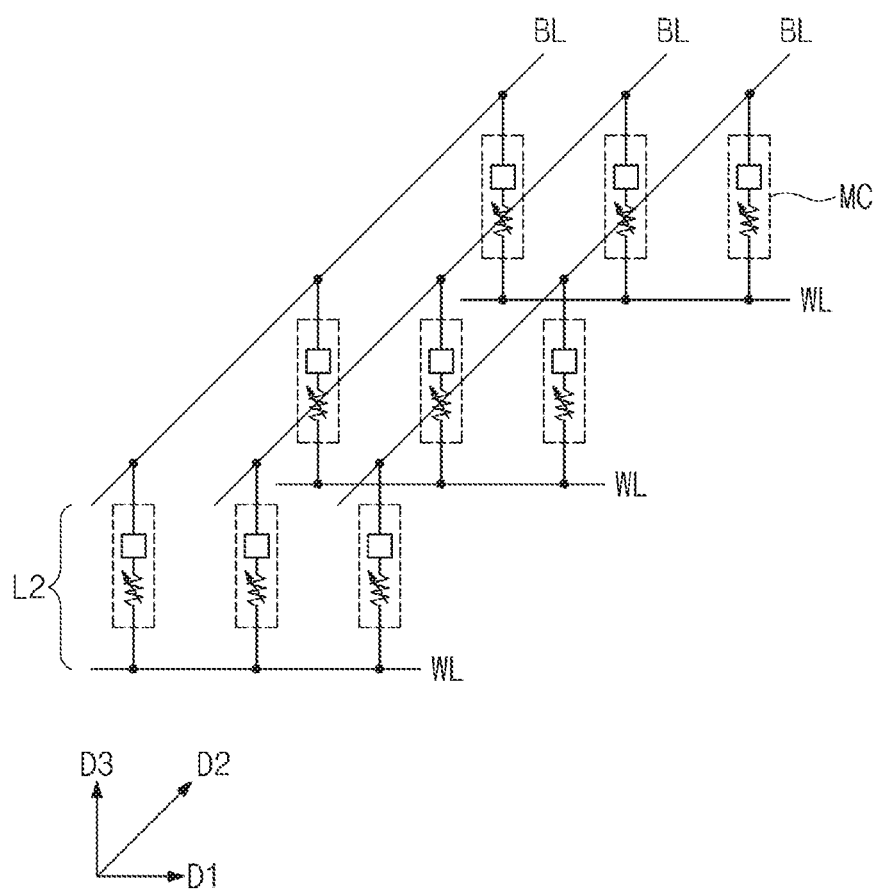
FIG. 16 illustrates memory cells disposed in layer L2 of FIG. 15 according to an exemplary embodiment of the inventive concept.

FIG. 16 illustrates memory cells disposed in the layer L2 of FIG. 14 according to an exemplary embodiment of the inventive concept. A layer L2 may correspond to the layer L2 of FIG. 15. Directions D1 to D3 may be perpendicular to each other. The direction D1 may indicate a direction in which bit lines BL are disposed, the direction D2 may indicate a direction in which word lines WL are disposed, and the direction D3 may correspond to a stacked direction of the layers L1 and L2 and a direction facing away from the layer L2 in a plan view. Each of the memory cells MC may be disposed or located at a cross point of the word line WL and the bit line BL. The word lines WL may be located above the bit lines BL along the direction D3. As illustrated in FIG. 16, a memory element and a selection element of each of the memory cells MC may be respectively connected to the word line WL and the bit line BL. As described above, because the memory cell MC has a bidirectional characteristic, unlike the example illustrated in FIG. 16, the memory element and the selection element of each of the memory cells MC may be respectively connected to the word line WL and the bit line BL.

Figure 17:
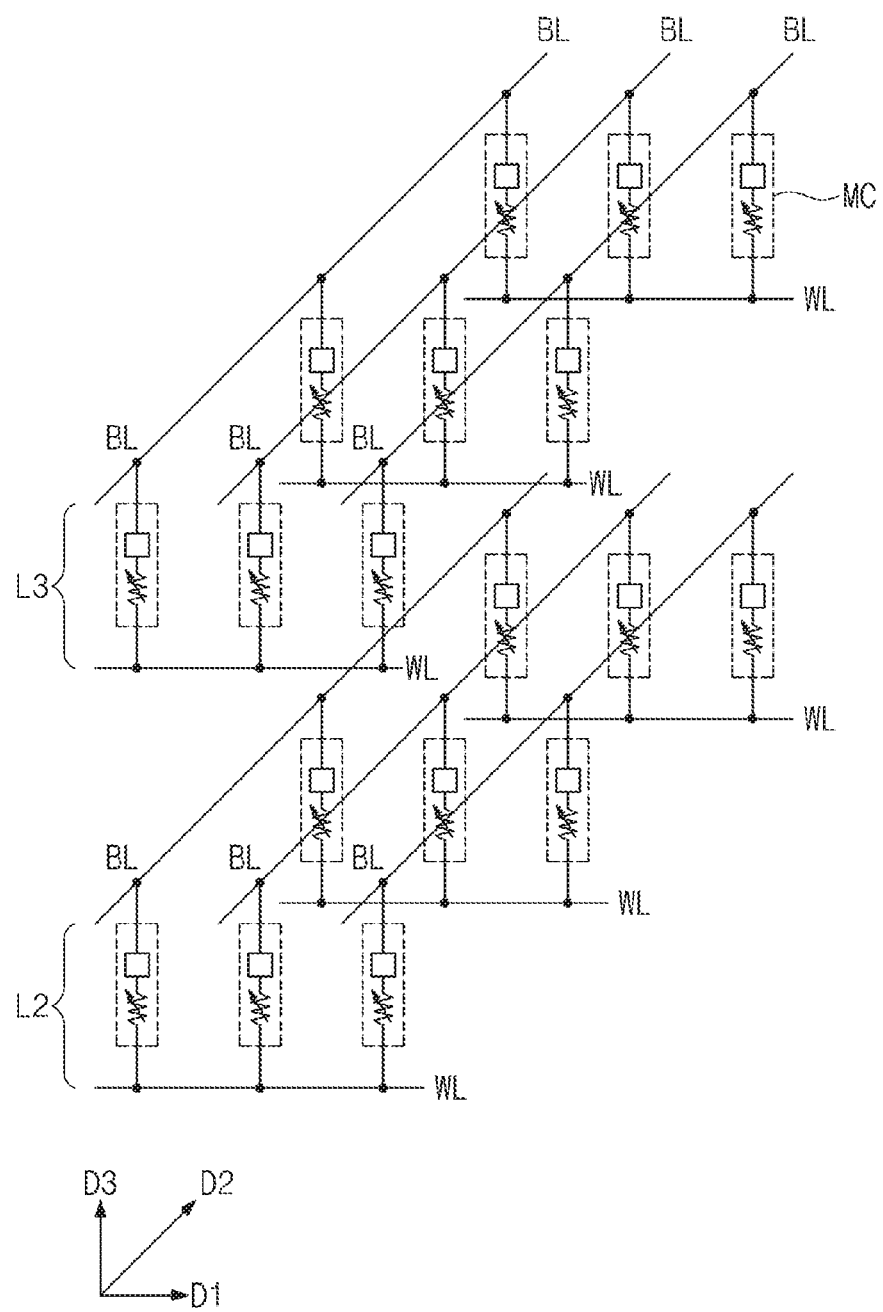
FIGS. 17 to 19 illustrate memory cells disposed in the layer L2 of FIG. 15 and memory cells disposed in a layer L3 above the layer L2 according to an exemplary embodiment of the inventive concept.
Figure 18:
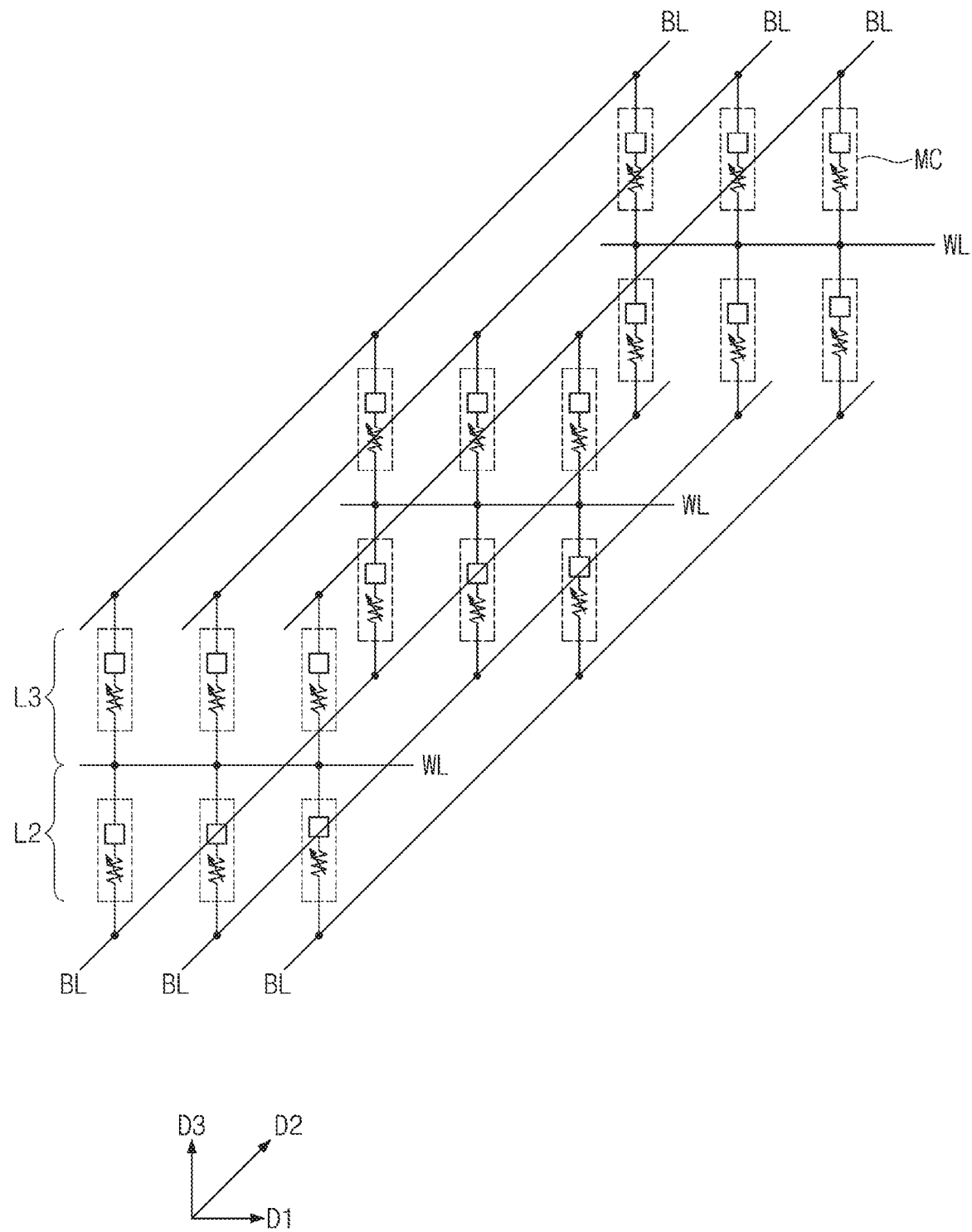
Figure 19:
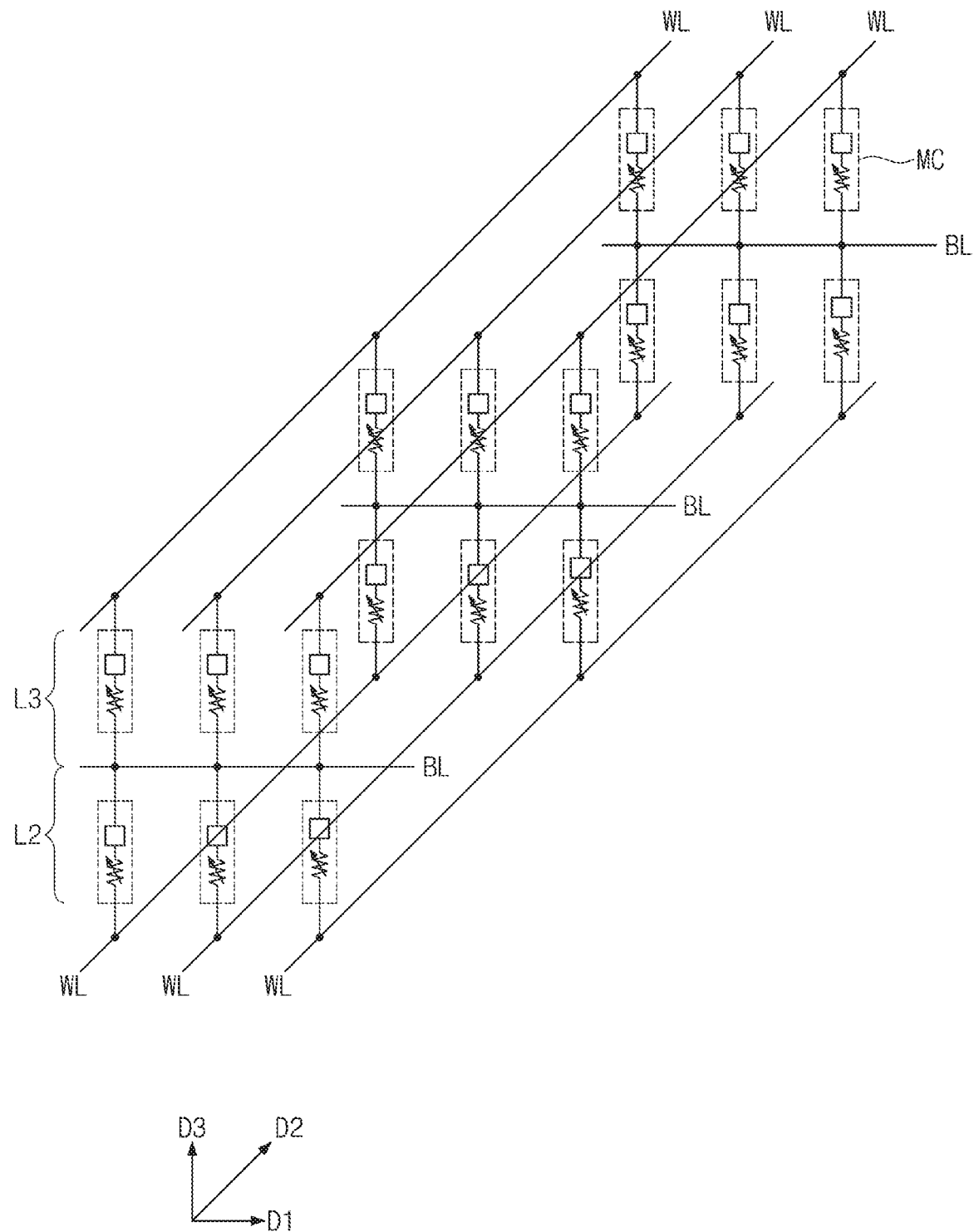

FIGS. 17 to 19 illustrate memory cells disposed in the layer L2 of FIG. 15 and memory cells disposed in a layer L3 above the layer L2 according to exemplary embodiments of the inventive concept. The memory device 500 may further include the memory cells MC disposed in the layer L3 located, disposed, or stacked above/on the layer L2. The number of layers where the memory cells MC are disposed may be one or more. Referring to FIG. 17, the placement of the memory cells MC of the layer L2 may be substantially identical to the placement of the memory cells MC of the layer L2 of FIG. 16. The memory cells MC of the layer L3 may be disposed to be similar to be the memory cells MC of the layer L2. Each of the layers L2 and L3 may include the bit lines BL and the word lines WL. As described above, because the memory cell MC has a bidirectional characteristic, locations of a memory element and a selection element of each of the memory cells MC are not limited to the example illustrated in FIG. 17 and may be interchangeable.

Referring to FIGS. 18 and 19, the placement of the memory cells MC of the layer L2 may be similar to the placement of the memory cells MC of the layer L2 of FIG. 16. The placement of the memory cells MC of the layer L3 may be similar to the placement of the memory cells MC of the layer L2 of FIG. 16. Referring to FIG. 18, the layers L2 and L3 may include the word lines WL in common, and the word lines WL may be shared by the layers L2 and L3. In contrast, referring to FIG. 19, the layers L2 and L3 may include the bit lines BL in common, and the bit lines BL may be shared by the layers L2 and L3. As described above, because the memory cell MC has a bidirectional characteristic, as described with reference to FIG. 16, locations of a memory element and a selection element of each of the memory cells MC may be interchangeable without limitation to FIGS. 18 and 19, the memory element may be connected to one of the word line WL and the bit line BL, and the selection element may be connected to one of the bit line BL and the word line WL.

An example where, in each of the layers L2 and L3, the memory element is located below the selection element with respect to the direction D3, is illustrated in FIGS. 18 and 19. However, in each of the layers L2 and L3, the memory element may be located above the selection element with respect to the direction D3. The placement of the memory cells MC of the even-numbered layer L2 and the placement of the memory cells MC of the odd-numbered layer L3 is not symmetrical with respect to a plane defined by the directions D1 and D2. In contrast, in the even-numbered layer L2, the memory element is located below (or above) the selection element; in the odd-numbered layer L3, the memory element is located above (or below) the selection element. In this case, the placement of the memory cells MC of the even-numbered layer L2 and the placement of the memory cells MC of the odd-numbered layer L3 are symmetrical with respect to the plane defined by the directions D1 and D2.

In an embodiment, although not illustrated in FIGS. 18 and 19, at least one layer L4 may be stacked above/on the layer L3 of FIGS. 18 and 19. In this case, any two layers may include the word lines WL in common or may share the word lines WL, as illustrated in FIG. 18; and other two layers may include the bit lines BL in common or may share the bit lines BL, as illustrated in FIG. 19.

In an embodiment, the increment "VTH–VS" of the target level VTARGET in operation S110 of FIG. 7 and the increment "VTH–VS" of the target level VTARGET in operation S150 of FIG. 7 may vary depending on the above layers L2 and L3 described in FIGS. 16 to 19. A distribution (or characteristic) of the switching voltages VS of the memory cells MC and a distribution (or characteristic) of the threshold voltages VTH of the memory cells MC may vary depending on the layers L2 and L3 where the memory cells MC are located. The bay control circuit 520 of FIG. 15 may differently set the target level VTARGET of operation S110 to be applied to the memory cell MC of the layer L2 and the target level VTARGET of operation S110 to be applied to the memory cell MC of the layer L3. For example, as a height of a layer where the memory cell MC is located increases in the direction D3, the target level VTARGET of operation S110 may increase (or decrease). The bay control circuit 520 of FIG. 15 may differently set the increment "VTH–VS" of the target level VTARGET of operation S110 to be applied to the memory cell MC of the layer L2 and the increment "VTH–VS" of the target level VTARGET of operation S110 to be applied to the memory cell MC of the layer L3. For example, as a height of a layer where the memory cell MC is located increases in the direction D3, the increment "VTH–VS" of the target level VTARGET of operation S150 may become greater (or smaller). For example, the target level VTARGET1 illustrated in FIGS. 8 to 11 may vary depending on the layers L2 and L3, and the target level VTARGET2 illustrated in FIGS. 8 to 11 may also vary depending on the layers L2 and L3.

Figure 20:
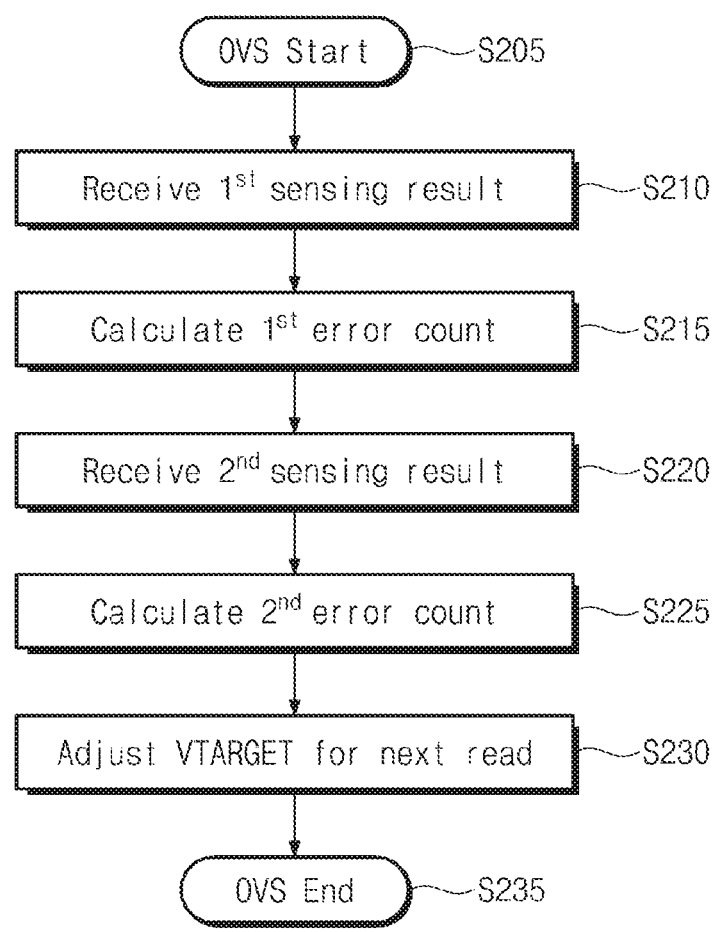
FIG. 20 illustrates a flowchart of an on-chip valley search operation according to an exemplary embodiment of the inventive concept.

FIG. 20 illustrates a flowchart of an on-chip valley search operation according to an exemplary embodiment of the inventive concept. In operation S205, the data processing circuit 533 starts an on-chip valley search (OVS) operation under control of the command decoder 531 that receives a read command or a command for requesting the on-chip search operation from the outside of the memory device 500. The data processing circuit 533 may perform the on-chip search operation to search for or track an optimum read voltage of the memory cell MC.

In operation S210, the data processing circuit 533 receives a first sensing result from the read/write control circuits 525 of the selected bay control circuits 520. The first sensing result of operation S210 may correspond to a sensing result that is generated in operation S135 in a state where the target level VTARGET1 is applied to the memory cell 110 as each of the selected bay control circuits 520 first performs operation S105 to operation S135 of FIG. 7. In operation S215, the error correction circuit 534 calculates a first error count data from the first sensing result. The processing circuit 533 may provide the first sensing result to the error correction circuit 534. The error correction circuit 534 may provide the first error count to the data processing circuit 533.

In operation S220, the data processing circuit 533 receives a second sensing result from the read/write control circuits 525 of the selected bay control circuits 520. The second sensing result of operation S220 may correspond to a sensing result that is generated in operation S135 in a state where the target level VTARGET2 is applied to the memory cell 110 as each of the selected bay control circuits 520 performs operation S150 and again performs operation S115 to operation S135 of FIG. 7. In operation S225, the error correction circuit 534 calculates a second error count data from the second sensing result. The data processing circuit 533 may provide the second sensing result to the error correction circuit 534. The error correction circuit 534 may provide the second error count to the data processing circuit 533.

In operation S230, the data processing circuit 533 may adjust the target level VTARGET for a next read operation based on the first and second error counts. The data processing circuit 533 may control the read/write control circuit 525 and the column driver 220 of each of the bay control circuits 520 and the voltage generator 538 for adjusting the target level VTARGET. For example, under control of the data processing circuit 533, the voltage generator 538 may adjust the reference voltages VREF1 and VREF2 used to output the target level VTARGET and may output voltages having the adjusted target levels VTARGET1 and VTARGET2. When a first input command is input to the memory device 500, the data processing circuit 533 may receive the first and second sensing results in operation S210 and operation S220 and output these results to the error correction circuit 534 to calculate the first and second error counts in operation S215 and operation S225. For example, the data processing circuit 533 may compare the first and second error counts. When a second read command is input to the memory device 500 and a read operation is again performed, the data processing circuit 533 may adjust the target level VTARGET set in operation S105 of FIG. 7 to the target level VTARGET used to obtain a sensing result that shows a relatively low error count. That is, the target level VTARGET that is set in operation S105 after the first input command is input to the memory device 500 may be different from the target level VTARGET that is set in operation S150 after the second input command is input to the memory device 500. In an embodiment, in operation S230, the data processing circuit 533 may adjust the target level VTARGET based on a first on-cell count and a second on-cell count respectively calculated by the on cell counter 535 with regard to the first sensing result and the second sensing result. In another embodiment, in operation S230, the data processing circuit 533 may adjust the target level VTARGET based on first ratio information and second ratio information respectively obtained by the randomizer 536 with regard to the first sensing result and the second sensing result. In another embodiment, the data processing circuit 533 may adjust the target level VTARGET by combining the error count, the on-cell count, and the ratio information.

In operation S235, the data processing circuit 533 terminates the on-chip search operation. Unlike the example illustrated in FIG. 20, each of the number of times that a sensing result is received before operation S230 and the number of times that information about a sensing result is calculated may be 2 or more.

FIGS. 21 to 24 are block diagrams illustrating electronic devices to which a memory device according to an embodiment of the inventive concept is applied. Each of electronic devices 1000 to 4000 may be referred to as a "computing system", a "memory system", an "electronic system", or a "communication system". For example, each of the electronic devices 1000 to 4000 may be a desktop computer, a laptop computer, a tablet computer, a mobile device, a smartphone, a personal digital assistant (PDA), a portable multimedia player (PMP), a wearable device, a video game console, a workstation, a server, a data processing device capable of using or supporting an interface protocol proposed by the mobile industry processor interface (MIPI) alliance, home appliances, a black box, a drone, etc.

Figure 21:
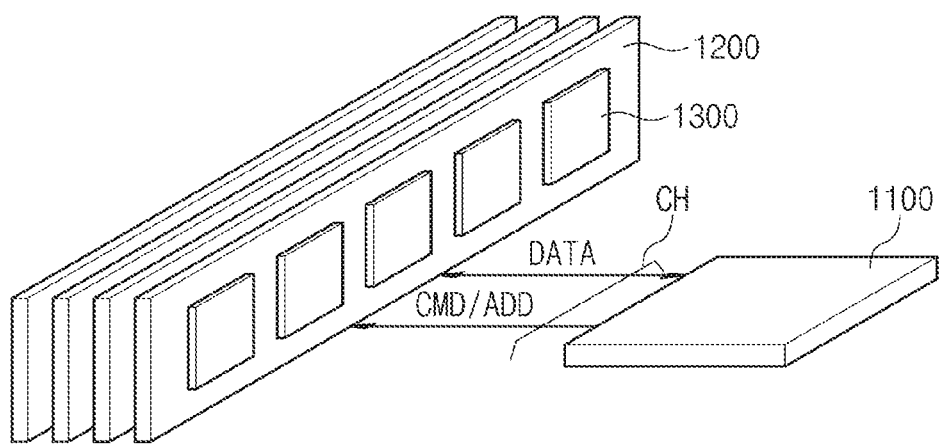
FIGS. 21 to 24 are block diagrams illustrating electronic devices to which a memory device according to an exemplary embodiment of the inventive concept is applied.

Referring to FIG. 21, the electronic device 1000 includes a host 1100 and a memory module 1200. The host 1100 may exchange data with the memory module 1200. For example, the host 1100 may include one or more cores. The host 1100 may include a memory controller that controls the memory module 1200. The memory controller may transmit at least one of a command CMD, an address ADD, and data "DATA" to the memory module 1200 through a channel CH or may receive the data "DATA" from the memory module 1200 through the channel CH.

The memory module 1200 may include a memory device 1300. In the electronic device 1000, the number of memory modules 1200 and the number of memory devices 1300 attached to one memory module 1200 are not limited to the example of FIG. 11. The memory module 2300 may be a single in-line module (SIMM) or a dual in-line memory module (DIMM). The memory devices 1300 may include at least one of the memory devices 100 to 500 described with reference to FIGS. 1 to 20, a static random access memory (SRAM) device, a dynamic RAM (DRAM) device, a thyristor RAM (TRAM) device, a NAND flash memory device, a NOR flash memory device, a resistive RAM (RRAM), and a ferroelectric RAM (FRAM), and the number of kinds of memory devices 1300 may be one or more. For example, the memory module 1200 may be a SIMM, a DIMM, a registered DIMM (RDIMM), a load reduced DIMM (LRDIMM), an unbuffered DIMM (UDIMM), a fully buffered DIMM (FB-DIMM), a small outline DIMM (SO-DIMM), a non-volatile DIMM (NVDIMM), etc.

Figure 22:
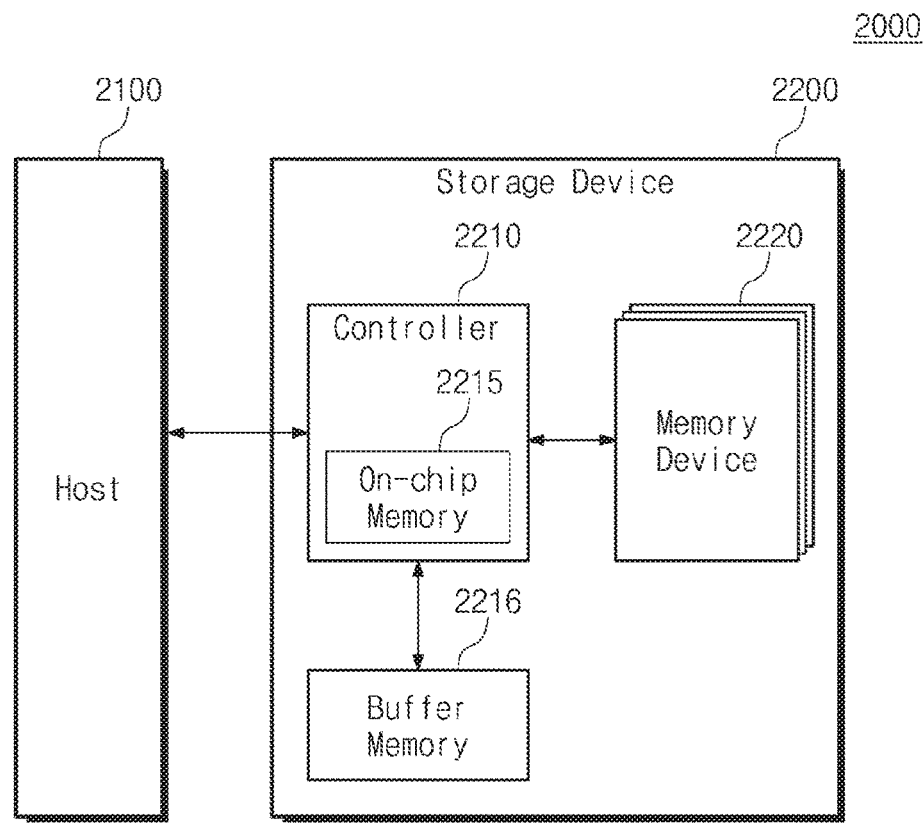

Referring to FIG. 22, the electronic device 2000 includes a host 2100 (e.g., a host device) and a storage device 2200. The host 2100 may exchange data with the storage device 2200. The storage device 2200 includes a controller 2210 including an on-chip memory 2215, a buffer memory 2216, and memory devices 2220. The controller 2210 may process a request of the host 2100, may execute a program loaded onto the on-chip memory 2215 or the buffer memory 2216, and may control the memory devices 2220. The on-chip memory 2215, the buffer memory 2216, and the memory devices 2220 may include at least one of the memory devices 100 and 500 described with reference to FIGS. 1 to 20, an SRAM device, a DRAM device, a TRAM device, a NAND flash memory device, a NOR flash memory device, an RRAM device, a FRAM device, and an MRAM device. For example, the storage device 2200 may be a solid state drive (SSD) device, a memory card capable of being attached to or detached from the electronic device 2000, a secure digital (SD) card, an embedded multimedia card (eMMC), a universal flash storage (UFS) card, etc. The host 2100 or the controller 2210 may request the read operation according to the flowchart of FIG. 7 or the OVS operation according to the flowchart of FIG. 20 from the on-chip memory 2215 or the memory device 2220.

Figure 23:
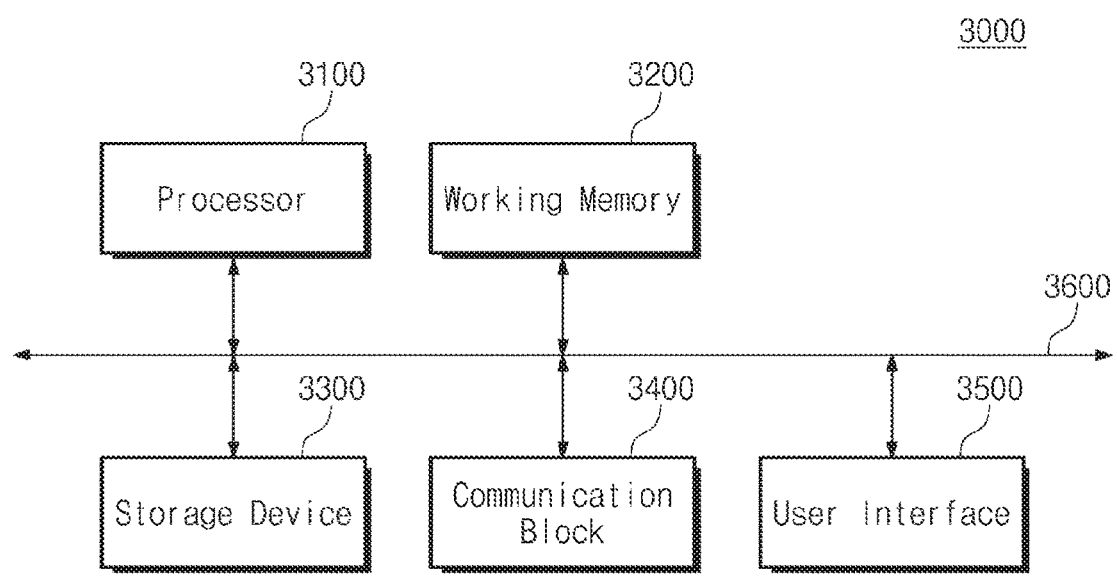

Referring to FIG. 23, the electronic device 3000 includes a processor 3100, a working memory 3200, a storage device 3300, a communication block 3400 (e.g., a modem or network card), a user interface 3500, and a bus 3600. The working memory 3200 and the storage device 3300 may exchange data with the processor 3100. The working memory 3200 may be used as a buffer or a cache of the electronic device 3000. The storage device 3300 may store data regardless of whether power is supplied. The working memory 3200 and the storage device 3300 may include at least one of the memory devices 100 and 500 described with reference to FIGS. 1 to 20, an SRAM device, a DRAM device, a TRAM device, a NAND flash memory device, a NOR flash memory device, an RRAM device, a FRAM device, and an MRAM device. The communication block 3400 may communicate with the outside of the electronic device 3000. The user interface 3500 may allow a user to communicate with the electronic device 3000. The bus 3600 may provide a communication path between the components of the electronic device 3000.

Figure 24:
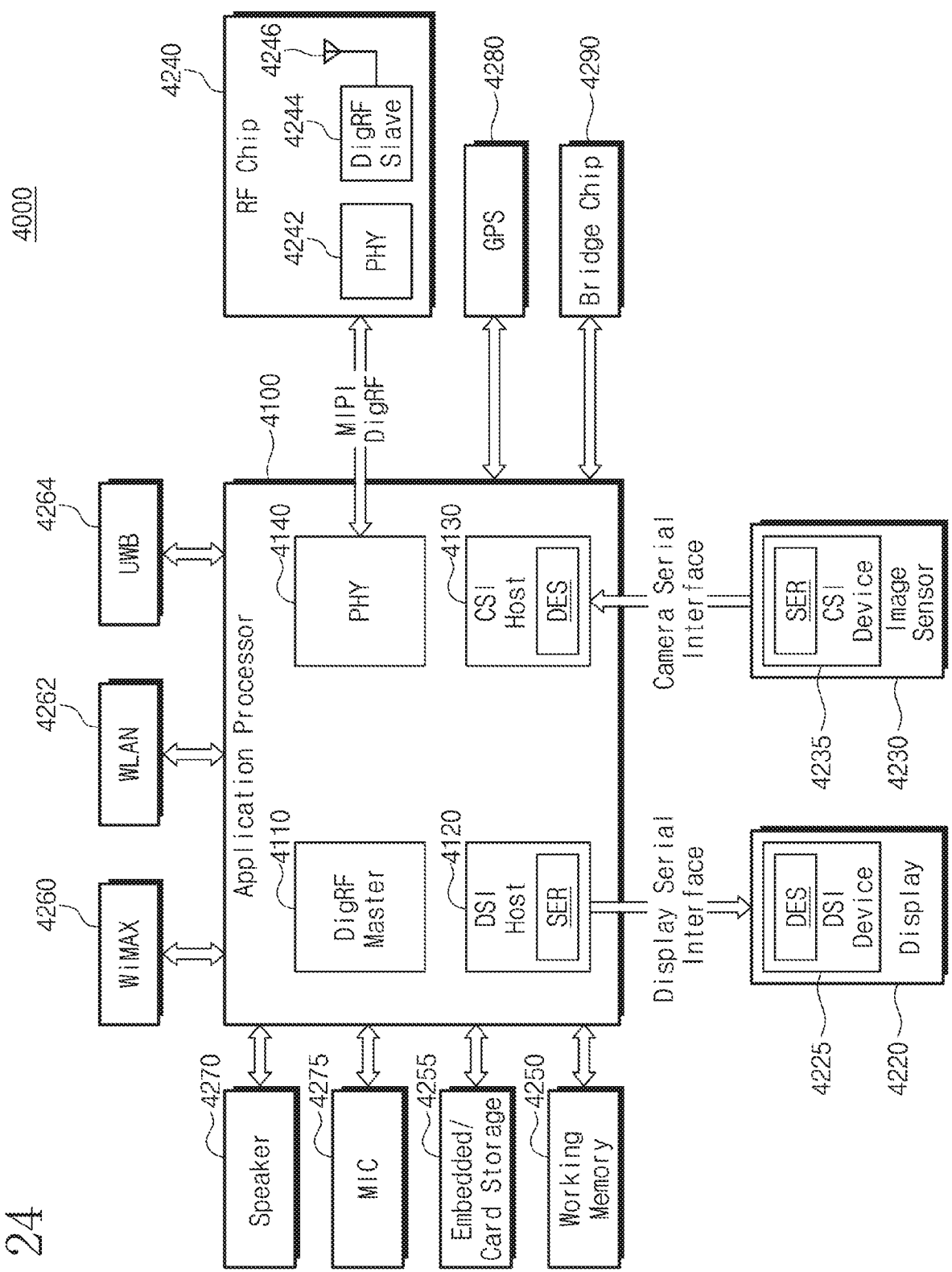

Referring to FIG. 24, the electronic device 4000 includes an application processor 4100, a display 4220, and an image sensor 4230. The application processor 4100 may include a DigRF master 4110, a display serial interface (DSI) host 4120, a camera serial interface (CSI) host 4130, and a physical layer 4140. The DSI host 4120 may communicate with a DSI device 4225 of the display 4220 in compliance with the DSI. For example, a serializer SER may be implemented in the DSI host 4120, and a deserializer DES may be implemented in the DSI device 4225. The CSI host 4130 may communicate with a CSI device 4235 of the image sensor 4230 through a CSI. For example, a deserializer DES may be implemented in the CSI host 4130, and a serializer SER may be implemented in the CSI device 4235. The electronic device 4000 may further include a radio frequency (RF) chip 4240 that communicates with the application processor 4100. The RF chip 4240 may include a physical layer 4242, a DigRF slave 4244, and an antenna 4246. For example, the physical layer 4242 and the physical layer 4140 may exchange data with each other in compliance with a DigRF interface proposed by the MIPI alliance. The electronic device 4000 may further include a working memory 4250 and an embedded/card storage device 4255. The working memory 4250 and the embedded/card storage 4255 may store or output data associated with the application processor 4100. The working memory 4250 and the embedded/card storage device 4255 may include at least one of the memory devices 100 and 500 described with reference to FIGS. 1 to 20, an SRAM device, a DRAM device, a TRAM device, a NAND flash memory device, a NOR flash memory device, an RRAM device, a FRAM device, and an MRAM device. The embedded storage device 4255 may be embedded in the electronic device 4000, and the card storage device 4255 that is a removable device may be mounted on the electronic device 4000. The electronic device 4000 may communicate with an external device/system through a communication module, such as a worldwide interoperability for microwave access (WiMAX) 4260, a wireless local area network (WLAN) 4262, or an ultra-wideband (UWB) 4264. The electronic device 4000 may further include a speaker 4270, a microphone 4275, a global positioning system (GPS) device 4280, and a bridge chip 4290.

According to at least one embodiment of the inventive concept, the reliability or endurance of a memory cell may be improved by avoiding a multi-turn on of the memory cell. Also, a sensing margin of a selected memory cell may be improved by preventing a word line voltage from being changed due to an off current of an unselected memory cell. Also, a plurality of sensing results may be obtained through one read operation, and the plurality of sensing results may be used to determine an optimum read voltage for each memory cell.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A memory device comprising:
   a memory cell connected to a word line and a bit line;
   a row driver configured to drive the word line to a precharge level;
   a column driver configured to drive the bit line to a first target level;
   a sense amplifier configured to sense a first sensing level of the word line after the first target level is applied to the memory cell; and
   a read control circuit configured to control the column driver so that a second target level different from the first target level is selectively applied to the memory cell depending on the first sensing level sensed by the sense amplifier,
   wherein the read control circuit is further configured to control the column driver so that the second target level is not applied to the memory cell and terminate a read operation of the memory cell, when the first sensing level indicates the memory cell is turned on.

2. The memory device of claim 1, wherein the first sensing level indicates the memory cell is turned on when the first sensing level is higher than a reference level.

3. The memory device of claim 1, wherein the read control circuit is further configured to: control the column driver so that the second target level is applied to the memory cell and perform a read operation of the memory cell, when the first sensing level is lower than a reference level.

4. The memory device of claim 1, wherein the column driver is further configured to drive the bit line to the second target level under control of the read control circuit, and wherein the sense amplifier is further configured to sense a second sensing level of the word line after the second target level is applied to the memory cell.

5. The memory device of claim 4, wherein the sense amplifier is enabled by the read control circuit after the bit line is driven to the first target level and is enabled by the read control circuit after the bit line is driven to the second target level.

6. The memory device of claim 1, wherein the row driver is further configured to: discharge the word line to the precharge level after the first sensing level is sensed by the sense amplifier.

7. The memory device of claim 6, wherein a speed at which the word line is discharged by the row driver is slower than a speed at which a level of the bit line driven to the first target level decreases.

8. The memory device of claim 1, wherein a difference between the second target level and the first target level is based on a difference between a threshold voltage and a switching voltage of the memory cell.

9. The memory device of claim 1, further comprising:
   a row decoder including a switch connected between the word line and a sensing data line connected to the sense amplifier, and
   wherein the switch electrically connects the word line and the sensing data line when the bit line is driven to the first target level by the column driver.

10. A memory device comprising:
    a plurality of bays each including a memory cell connected to a word line and a bit line; and
    a plurality of bay control circuits each configured to access the memory cell through the word line and the bit line,
    wherein each of the plurality of bay control circuits is configured to:
    perform a first sensing operation on the memory cell by driving the word line to a precharge level and driving the bit line to a first target level, based on a first read command; and
    perform a second sensing operation on the memory cell by driving the word line to the precharge level and selectively driving the bit line to a second target level, based on a first sensing result of the first sensing operation,
    wherein each of the plurality of bay control circuits does not perform the second sensing operation when the first sensing result indicates that the memory cell is turned on and performs the second sensing operation when the first sensing result indicates that the memory cell is turned off.

11. The memory device of claim 10, further comprising:
    a data processing circuit configured to receive the first sensing result and a second sensing result of the second sensing operation from each of the plurality of bay control circuits and to adjust the first target level based on the first sensing result and the second sensing result.

12. The memory device of claim 11, wherein each of the plurality of bay control circuits is further configured to:
    perform a third sensing operation on the memory cell by driving the word line to the precharge level and driving the bit line to the first target level adjusted by the data processing circuit, based on a second read command.

13. The memory device of claim 11, further comprising:
an error correction circuit configured to perform a first error correction operation on the first sensing result and a second error correction operation on the second sensing result, and
wherein the data processing circuit is further configured to adjust the first target level based on a first error count corresponding to a result of the first error correction operation and a second error count corresponding to a result of the second error correction operation.

14. The memory device of claim 10, wherein the memory cell comprises a memory element including a phase change material and a selection element, wherein a command decoder and the plurality of bay control circuits are disposed in a first layer of the memory device, and wherein the plurality of bays are disposed in a second layer above the first layer.

15. The memory device of claim 10, wherein each of the plurality of bay control circuits comprises:
a row driver configured to drive the word line to the precharge level, and to stop driving of the word line driven to the precharge level or maintain the word line at the precharge level;
a column driver configured to drive the bit line to the first target level, and to stop driving of the bit line to the first target level or maintain the bit line at the precharge level;
a sense amplifier configured to sense a first sensing level of the word line after the first target level is applied to the memory cell; and
a read control circuit configured to control the column driver so that the second target level is selectively applied to the memory cell depending on the first sensing result.

16. The memory device of claim 15, wherein, during at least a portion of a period where the bit line is driven to the first target level, the row driver does not drive the word line to the precharge level or maintains the word line at the precharge level.

17. An operating method of a memory device comprising:
setting a second target level based on a difference between a threshold voltage and a switching voltage of a memory cell;
driving a word line connected to the memory cell to a precharge level;
driving a bit line connected to the memory cell to a first target level;
performing a first sensing operation for sensing a first sensing level of the word line after the bit line is driven to the first target level; and
determining whether to perform a second sensing operation by using the second target level different from the first target level, depending on a first sensing result of the first sensing operation.

18. The operating method of claim 17, wherein the determining comprises:
determining whether the memory cell is turned on or turned off by the precharge level and the first target level, wherein, when it is determined that the memory cell is turned on, the second sensing operation is not performed, and
wherein, when it is determined that the memory cell is turned off, the second sensing operation is performed.

19. The operating method of claim 17, further comprising:
discharging the word line to the precharge level after the first sensing level is sensed.

* * * * *